(12) United States Patent
Sugibayashi et al.

(10) Patent No.: US 7,492,629 B2
(45) Date of Patent: Feb. 17, 2009

(54) MAGNETIC RANDOM ACCESS MEMORY AND OPERATING METHOD OF THE SAME

(75) Inventors: Tadahiko Sugibayashi, Tokyo (JP); Noboru Sakimura, Tokyo (JP); Takeshi Honda, Tokyo (JP)

(73) Assignee: NEC Corporation, Tokyo (JP)

( * ) Notice: Subject to any disclaimer, the term of this patent is extended or adjusted under 35 U.S.C. 154(b) by 119 days.

(21) Appl. No.: 11/614,231

(22) Filed: Dec. 21, 2006

(65) Prior Publication Data
US 2007/0159876 A1    Jul. 12, 2007

(30) Foreign Application Priority Data
Jan. 6, 2006    (JP) ............... 2006-001794
Jun. 6, 2006    (JP) ............... 2006-157574

(51) Int. Cl.
*G11C 11/00*    (2006.01)
(52) U.S. Cl. .................. 365/158; 365/171
(58) Field of Classification Search .......... 365/158, 365/171, 173
See application file for complete search history.

(56) References Cited

U.S. PATENT DOCUMENTS

| | | | | |
|---|---|---|---|---|
| 6,191,989 B1 | 2/2001 | Luk et al. | ............... | 365/207 |
| 6,795,340 B2 | 9/2004 | Sakimura et al. | ............... | 365/171 |
| 6,804,144 B2 * | 10/2004 | Iwata | ............... | 365/158 |
| 6,839,272 B2 * | 1/2005 | Ooishi | ............... | 365/171 |
| 6,914,808 B2 * | 7/2005 | Inaba | ............... | 365/158 |
| 7,184,301 B2 | 2/2007 | Sugibayashi et al. | ............... | 365/158 |
| 2003/0123199 A1 | 7/2003 | Honda et al. | ............... | 360/324 |
| 2007/0171704 A1 * | 7/2007 | Hung et al. | ............... | 365/158 |

FOREIGN PATENT DOCUMENTS

| | | |
|---|---|---|
| JP | 6-084347 | 3/1994 |
| JP | 2000-082791 | 3/2000 |
| JP | 2001-236781 | 8/2001 |
| JP | 2002-100181 | 4/2002 |
| JP | 2002-140889 | 5/2002 |
| JP | 2002-230965 | 8/2002 |
| JP | 2002-269968 | 9/2002 |
| JP | 2003-249072 | 5/2003 |

(Continued)

OTHER PUBLICATIONS

An International Search Report and a Written Opinion in Japanese language with English language translation of selected paragraphs issued by International Searching Authority on Jun. 26, 2007, pp. 1 to 11.

(Continued)

*Primary Examiner*—Anh Phung
(74) *Attorney, Agent, or Firm*—Whitham Curtis Christofferson & Cook, PC

(57) ABSTRACT

A semiconductor memory device is provided with a memory array including memory cells arranged in rows and columns; and a sense amplifier circuit. Each of the memory cells includes at least one magnetoresistive element storing data, and an amplifying member used to amplify a signal generated by a current through the at least one magnetoresistive element. The sense amplifier circuit identifies data stored in the at least one magnetoresistive element in response to an output signal of the amplifying member.

19 Claims, 25 Drawing Sheets

FOREIGN PATENT DOCUMENTS

| | | |
|---|---|---|
| JP | 2004-145952 | 5/2004 |
| JP | 2004-206796 | 7/2004 |
| JP | 2004-207707 | 7/2004 |
| JP | 2004-213771 | 7/2004 |
| JP | 2004-220759 | 8/2004 |
| JP | 2004-348934 | 12/2004 |
| JP | 2005-019561 | 1/2005 |
| JP | 2005-182986 | 7/2005 |
| JP | 2005-236177 | 9/2005 |
| JP | 2006-093432 | 4/2006 |

OTHER PUBLICATIONS

Hosomi, et al. "A Novel Nonvolatile Memory with Spin Torque Magnetization Switching:Spin-RAM", International Electron SDevices Meeting, Technical Digest, pp. 473-476, IEEE 2005.

* cited by examiner

MAGNETIC RANDOM ACCESS MEMORY AND OPERATING METHOD OF THE SAME

BACKGROUND OF THE INVENTION

1. Field of the Invention

The present invention relates to a magnetic random access memory (MRAM), which incorporates tunnel magnetoresistive elements within memory cells.

2. Description of the Related Art

In an MRAM memory cell, the resistance of a magnetic tunnel junction represents the cell data. In a commonly-known method for reading cell data from a memory cell of an MRAM, a predetermined voltage is applied to the memory cell, and the cell data is identified from the current through the memory cell, as disclosed in Japanese Laid-Open Patent Applications Nos. JP-A 2004-206796 and JP-A 2004-213771. Additionally, Japanese Laid-Open Patent Application No. JP-A 2005-182986 discloses a memory device incorporating cross-point resistor elements in which cell data is identified from the current through the associated cross-point resistor element. However, these conventional methods suffer from problems that current-voltage conversion, which takes considerable time, is required, and that the size of the read circuitry is undesirably increased.

One approach for solving these problems is to identify cell data from a voltage generated across an MRAM memory cell, as disclosed in Japanese Laid-Open Patent Application No. JP-A 2004-220759. FIG. 1 illustrates an equivalent circuit diagram of a memory cell disclosed in this patent application. The memory cell is composed of a pair of magnetoresistive elements each incorporating an MTJ, and a pair of transistors MN101 and MN102. In FIG. 2, the magnetoresistive elements J100 and J101 are represented as variable resistors.

In the memory cell shown in FIG. 1, complementary data are written into the magnetoresistive elements J100 and J101, which are connected in serial. The data write is achieved by generating write currents Iwx, Iwy0 and Iwy1 through a write word line WWL, a pair of write bitlines WBL and /WBL, respectively. The write currents Iwx, Iwy0 and Iwy1 generate a magnetic field to thereby write complementary data into the magnetoresistive elements 1100 and J101. When the high resistance state corresponds to a data "1" and the low resistance state corresponds to a data "0", the magnetoresistive elements J100 and J101 are written with data "0" and "1", respectively, or with data "1" and "0", respectively.

The data read is achieved by activating a read word line RWL, and driving the write bitlines WBL and /WBL to the power source voltage level (Vdd) and the ground voltage level (Vss), respectively. The generation of a voltage of Vdd-Vss between the write bitlines WBL and /WBL causes a read current Ir to flow through the magnetoresistive elements J100 and J101, and this generates a voltage level corresponding to the data written into the magnetoresistive elements J100 and J101 on a read bitline RBL.

One advantage of this memory cell architecture is that the output signal of the memory cell is a voltage signal and therefore the output signal can be rapidly amplified by a sense amplifier circuit, as is the case of the conventional DRAM memory cell architecture.

Japanese Laid-open Patent Application No. JP-A 2002-269968 discloses Another MRAM that identifies cell data from a voltage generated across an MRAM memory cell.

The selection of a memory cell to be written with write data in an MRAM is often achieved by using a transistor or a diode. Such a memory cell is disclosed in Japanese Laid-Open Patent Application No. JP-A 2004-348934. FIG. 2 is an equivalent circuit diagram of the disclosed memory cell. The MRAM memory cell shown in FIG. 2 is composed of a magnetoresistive element J102 and a pair of NMOS transistors MN102 and MN103. In the memory cell shown in FIG. 2, the write current is generated only through a memory cell desired to be written with write data, and the data write is achieved by the write current generated through the desired memory cell. More specifically, the data write is achieved by generating a current flowing from the bitline BL to the bitline /BL with the word line WL activated. This method effectively improves the selectivity of memory cells in write operations.

One problem of an MRAM which identifies cell data from the voltage generated across the memory cell is that the signal level obtained from the memory cell is not so large. The small signal level obtained from the memory cell makes it difficult to identify cell data, and undesirably hinders the improvement of the data read speed.

SUMMARY OF THE INVENTION

Therefore, an object of the present invention is to provide an MRAM that achieves high-speed read operation.

In an aspect of the present invention, a semiconductor memory device is provided with a memory array including memory cells arranged in rows and columns; and a sense amplifier circuit. Each of the memory cells includes one or more magnetoresistive elements storing data, and an amplifying member used to amplify a signal generated by a current through the one or more magnetoresistive element. The sense amplifier circuit identifies data stored in the at least one magnetoresistive element in response to an output signal of the amplifying member.

In a preferred embodiment, each of the memory cells includes serially-connected magnetoresistive elements, and an input of the amplifying member is connected to a cell node at which two of the serially-connected magnetoresistive elements are connected together.

In a preferred embodiment, the memory cell array further includes first write bitlines, second write bitlines, and read bitlines connected with the sense amplifier circuit. Each of the memory cells includes a first switch element connected between the cell node and associated one of the first write bitlines, and a second switch element connected between the cell node and associated one of the second write bitline. The output of the amplifying member is connected with associated one of the read bitlines.

In preferred embodiment, the memory array includes a plurality of pull-up lines. In this case, the serially-connected magnetoresistive elements preferably include a first magnetoresistive element connected between the cell node and associated one of the plurality of pull-up lines, and a second magnetoresistive element connected between the cell node and a ground terminal.

Preferably, at least one switch element is inserted into a current path along which a read current is flown through the serially-connected magnetoresistive elements.

In a preferred embodiment, the amplifying member includes an inverter.

In one embodiment, the inverter preferably includes a first PMOS transistor having a source connected with a power supply terminal, and a first NMOS transistor having a source connected with a ground terminal. In this case, the gates of the first PMOS transistor and first NMOS transistors are commonly connected with the cell node, and the drains of the first PMOS transistor and first NMOS transistors are commonly connected with a read bitline that is connected with the sense amplifier circuit.

In an alternative embodiment, the inverter may include a depletion NMOS transistor having a drain connected with a power supply terminal and a gate connected with a source thereof, and an NMOS transistor connected having a drain connected with the source of the depletion NMOS transistor, a gate connected with the cell node, and a source connected with a ground terminal. In this case, the drain of the NMOS transistor is further connected with a read bitline that is connected with the sense amplifier circuit.

Instead, the inverter may include a diode-connected NMOS transistor having a drain connected with a power supply terminal and a gate connected with the drain thereof, and an NMOS transistor having a drain connected with a source of the diode-connected NMOS transistor and a source connected with a ground terminal.

Preferably, each of the memory cells further includes a second NMOS transistor connected between an output of the inverter and a read bitline connected with the sense amplifier circuit.

It is also preferable that each of the memory cells further includes a second PMOS transistor connected between the output of the inverter and the read bitline.

In a preferred embodiment, the inverter further may include a second NMOS transistor connected between the read bitline and the ground terminal in series with the first NMOS transistor, and a gate of the second NMOS transistor is connected with a read word line.

It is also preferable that the inverter further includes a second PMOS transistor connected between the read bitline and the power supply terminal in series with the first PMOS transistor, and a gate of the second NMOS transistor is connected with a read word line.

In a preferred embodiment, the amplifying member includes serially-connected inverters.

Preferably, the semiconductor memory device further includes: a write circuit configured to write a write data into the at least one magnetoresistive element within one of the memory cells selected by a write address; a data latch configured to latch output data received from the sense amplifier circuit; an output circuit externally outputting data latched by the data latch, and an address matching detection circuit configured to detect matching of the write address and a read address, wherein the data latch is adapted to latch the write data from the write circuit in response to matching of the write address and the read address.

In another aspect of the present invention, a semiconductor memory device is provided with a memory array including memory cells arranged in rows and columns; and a sense amplifier circuit. Each of the memory cells includes one or more magnetoresistive element storing data. The memory array includes sub-sense amplifiers, each of which is associated with n memory cells and used to amplify a signal generated by a current through the one or more magnetoresistive elements, n being an integer of two or more. The sense amplifier circuit identifies data stored in the at least one magnetoresistive element in response to an output signal received from the sub-sense amplifiers.

In a preferred embodiment, each of the memory cells includes serially-connected magnetoresistive elements, and an input of the amplifying member is connected to a cell node at which two of the serially-connected magnetoresistive elements are connected together.

In one embodiment, each of the memory cells further includes an NMOS transistor connected between the cell node and a sub bitline connected with associated one of the sub-sense amplifiers.

In a preferred embodiment, each of the memory cells further includes an NMOS transistor having a gate connected with the cell node, a source connected with a ground terminal, and a drain connected with a sub bitline connected with associated one of the sub-sense amplifiers. In this case, each of the sub-sense amplifiers includes a diode-connected MOS transistor connected between the sub bitline and a power supply terminal, and a switch element connected between the sub bitline and a bitline connected with the sense amplifier circuit.

BRIEF DESCRIPTION OF THE DRAWINGS

The above and other advantages and features of the present invention will be more apparent from the following description taken in conjunction with the accompanied drawings, in which.

DESCRIPTION OF THE PREFERRED EMBODIMENTS

First Embodiment

Figure 1:
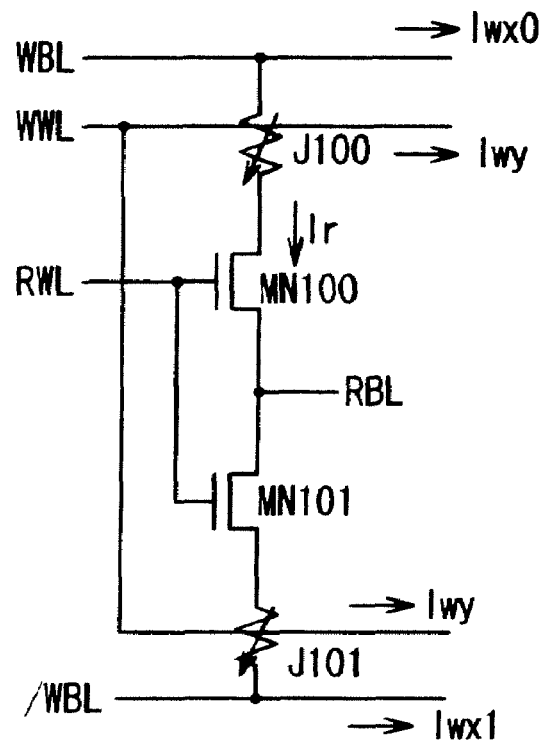
FIG. 1 is an equivalent circuit diagram showing the configuration of a conventional MRAM memory cell.
Figure 2:
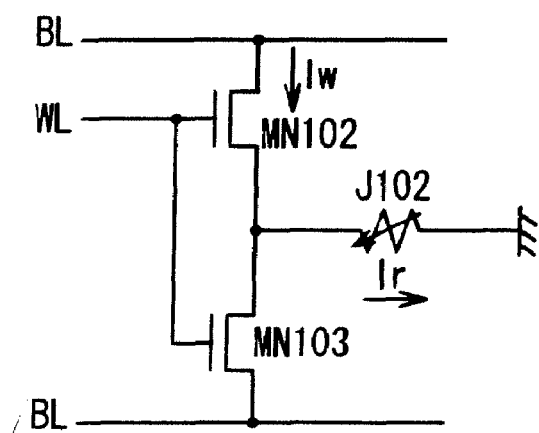
FIG. 2 is an equivalent circuit diagram showing the configuration of another conventional MRAM memory cell.
Figure 3:
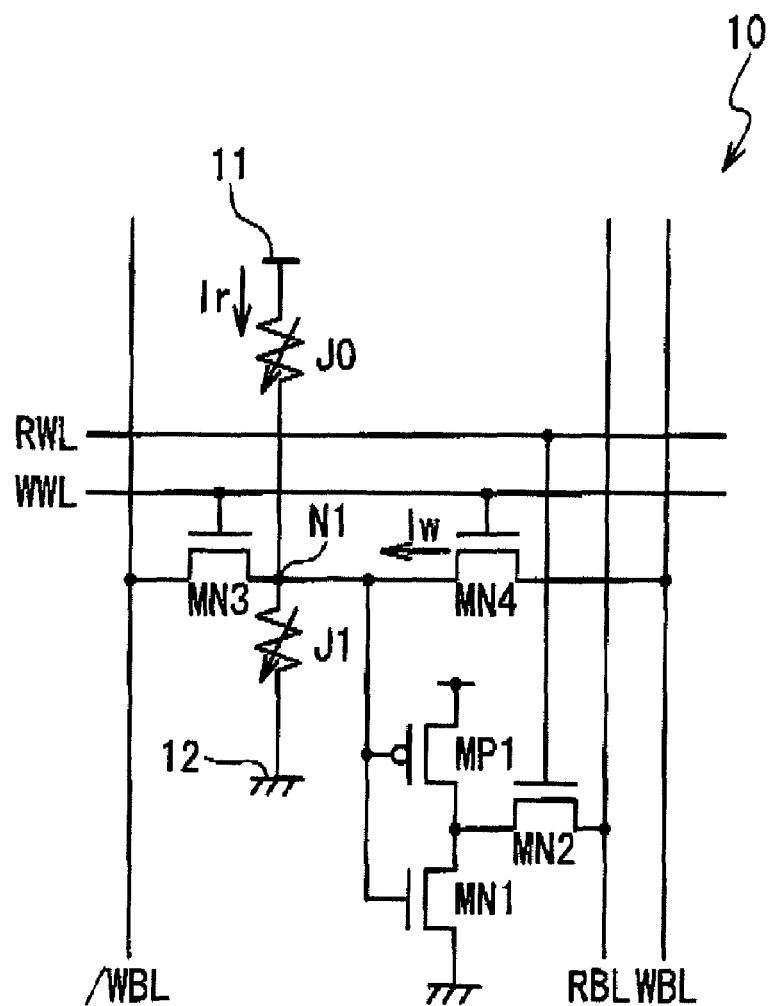
FIG. 3 is an equivalent circuit diagram showing the configuration of an MRAM memory cell in a first embodiment of the present invention.

FIG. 3 is an equivalent circuit diagram illustrating the configuration of a memory cell 10 integrated within an MRAM in a first embodiment. One feature of the MRAM in the first embodiment is that each memory cell 10 incorporates an inverter that amplifies a signal obtained from a series connected magnetoresistive elements.

Each memory cell 10 is provided with a pair of magnetoresistive elements J0 and J1 each incorporating an MTJ, NMOS transistors MN1 to MN4, and a PMOS transistor MP1. The magnetoresistive element J0 is connected between a power supply terminal 11 and a cell node N1, while the magnetoresistive element J1 is connected between the cell node N1 and a ground terminal 12, The NMOS transistor MN3 is connected between the cell node N1 and a write bitline /WBL, while the NMOS transistor MN4 is connected between the cell node N1 and a write bitline WBL. Gates of the NMOS transistors MN3 and MN4 are connected to the write word line WWL, and the NMOS transistors MN3 and MN4 function as switch elements which provide electrical connections between the cell node N1 and the write bitlines /WBL and WBL in response to activation of the write word line WWL. The PMOS transistor MP1 and the NMOS transistor MN1 operate as an inverter having an input connected to the cell node N1 and an output connected to a read bitline RBL via the NMOS transistor MN2. The read bitline RBL is connected to a sense amplifier circuit for identifying data of the memory cell 10. A gate of the NMOS transistor MN2 is connected to a read word line RWL and has a function as a transfer switch.

Complementary data are written into the two magnetoresistive element J0 and J1 to place one of the magnetoresistive elements J0 and J1 into the high resistance state and the other into the low resistance state.

In the memory cell 10 of the first embodiment, a read current Ir constantly flows from the power supply terminal 11 to the ground terminal 12. The read current Ir generates a voltage level corresponding to the data written into the magnetoresistive elements J0 and J1 on the cell node N1. The voltage level on the cell node N1 is selected from two allowed voltage levels in response to data written to the magnetoresistive elements J0 and J1. In the following explanation, the higher one of the two allowed voltage levels is referred to as high voltage level "1", and the lower one as the low voltage level "0". When data are written so as to place the magnetoresistive element J0 into the low resistance state and the magnetoresistive element J1 into the high resistance states the high voltage level "1" is generated on the cell node N1. On the contrary, when data are written so as to place the magnetoresistive element J0 into the high resistance state and the magnetoresistive element J1 into the low resistance state, the low voltage level "0" is generated on the cell node N1.

Data read is achieved by identifying the voltage level on the cell node N1. More specifically, the change in the voltage level on the cell node N1 is amplified by the inverter composed of the NMOS transistor MN1 and the PMOS transistor MP1 to output a digital signal corresponding to the voltage level on the cell node N1 outside the memory cell 10. The read word line RWL and the NMOS transistor MN2 are used to select the memory cell in read operations. In a conventional art, the difference between the high resistance and the low resistance in the magnetic tunnel junction is about several tens of percent, which is one of the main causes of the slow operating speed of an MRAM. On the contrary, the MRAM in this embodiment, amplification of signals in the memory cell allows increasing the speed of reading data.

Data write is achieve by driving the write bitlines WBL and /WBL to complementary voltage levels so as to generate a write current Iw after activating the write word line WWL. The direction of the write current Iw, which is determined by the voltage levels on the write bitlines WBL and /WBL, is selected in accordance with the write data.

Figure 12:
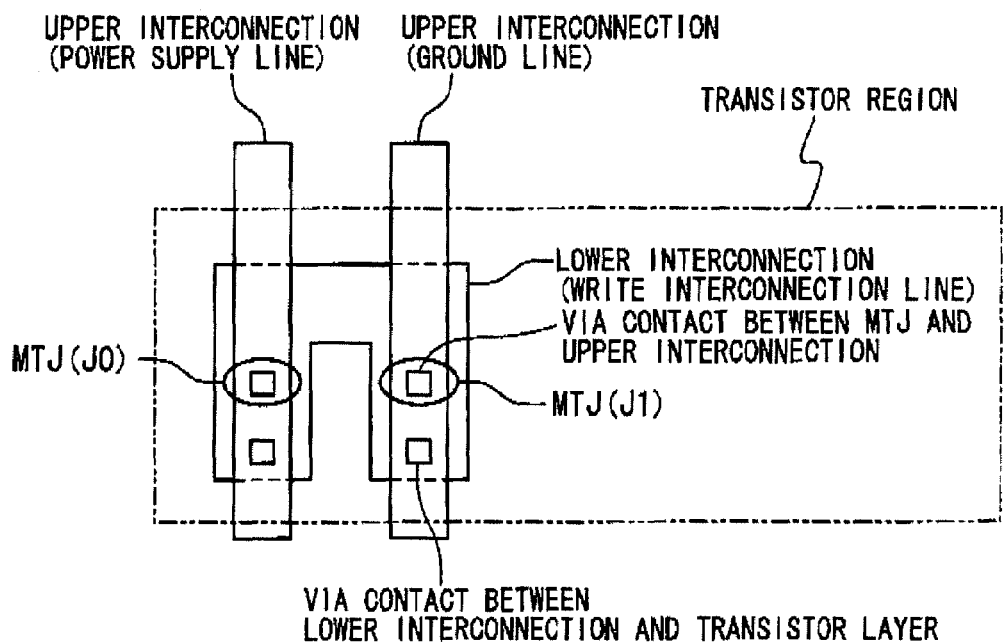
FIG. 12 is an upper surface diagram showing the configuration of the MRAM memory cell in the first embodiment of the present invention.
Figure 13:
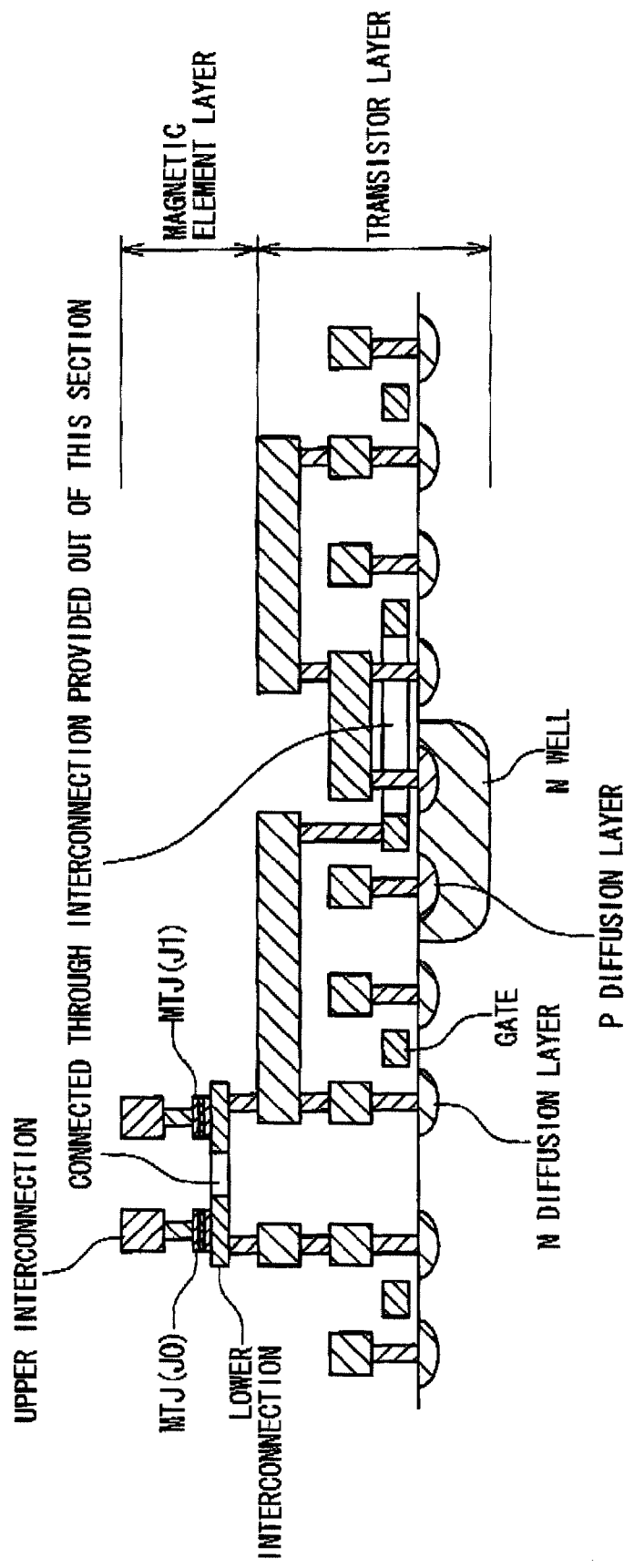
FIG. 13 is a cross sectional diagram showing the configuration of the MRAM memory cell in the first embodiment of the present invention.
Figure 14:
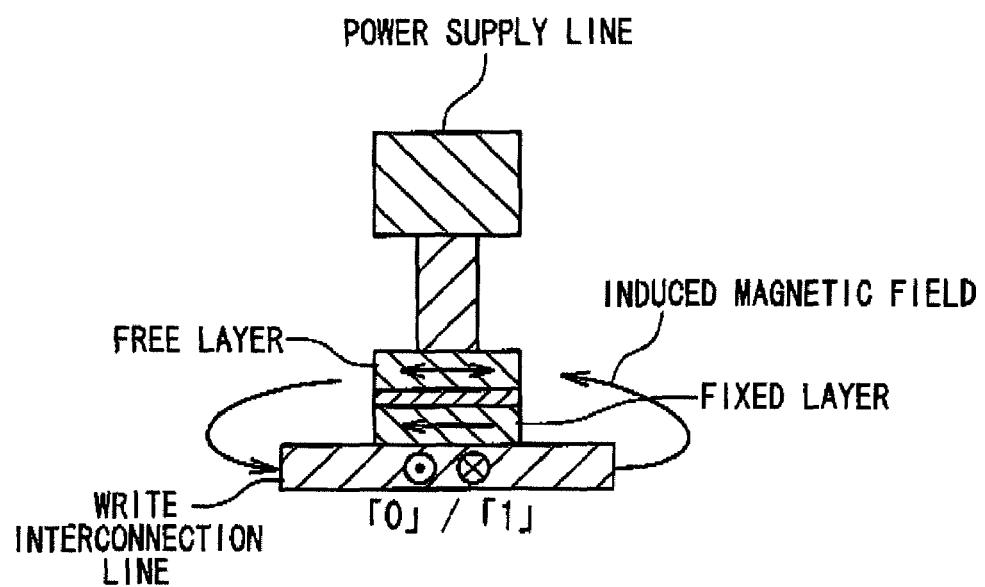
FIG. 14 is an enlarged cross sectional diagram showing the configuration of the MRAM memory cell in the first embodiment of the present invention.

Those skilled in the art would understand from FIGS. 12 to 14 that complementary data can be written into the two magnetoresistive elements J0 and J1 by simply generating the write current Iw through the cell node N1. FIG. 12 is an upper surface diagram of the memory cell 10. FIG. 12 shows details of a magnetic material layer without showing the transistors. FIG. 13 is a cross sectional diagram of the memory cell 10. FIG. 14 is an enlarged cross sectional diagram in the vicinity of the magnetoresistive elements J0 and J1. In a write operation, a write current is generated through the write interconnection line (the lower interconnection) in a direction perpendicular to the section shown in FIG. 14. Desired data selected from data "1" and "0" are written into free layers of the respective magnetoresistive elements J0 and J1 depending on the direction of the write current. Due to the special shape of the write interconnection write, current-induced magnetic fields are applied to the free layers of the magnetoresistive elements J0 and J1 in the opposite directions. Therefore, a pair of complementary data are written into the magnetoresistive elements J0 and J1. Although one issue may be that the write current is leaked from the magnetoresistive elements J0 and J1, one advantage of the above-described write operation is that there is no transistor to be driven by the write current. Accordingly, the write current is only required to have a magnitude enough to generate magnetic fields sufficient for reversing the magnetizations of the free layers; the tolerance is large with respect to the waveform of the write current, particularly the pulse width and the pulse shape thereof. Therefore, the structure of the memory cell 10 in this embodiment achieves extremely high-speed write operation.

Figure 4:
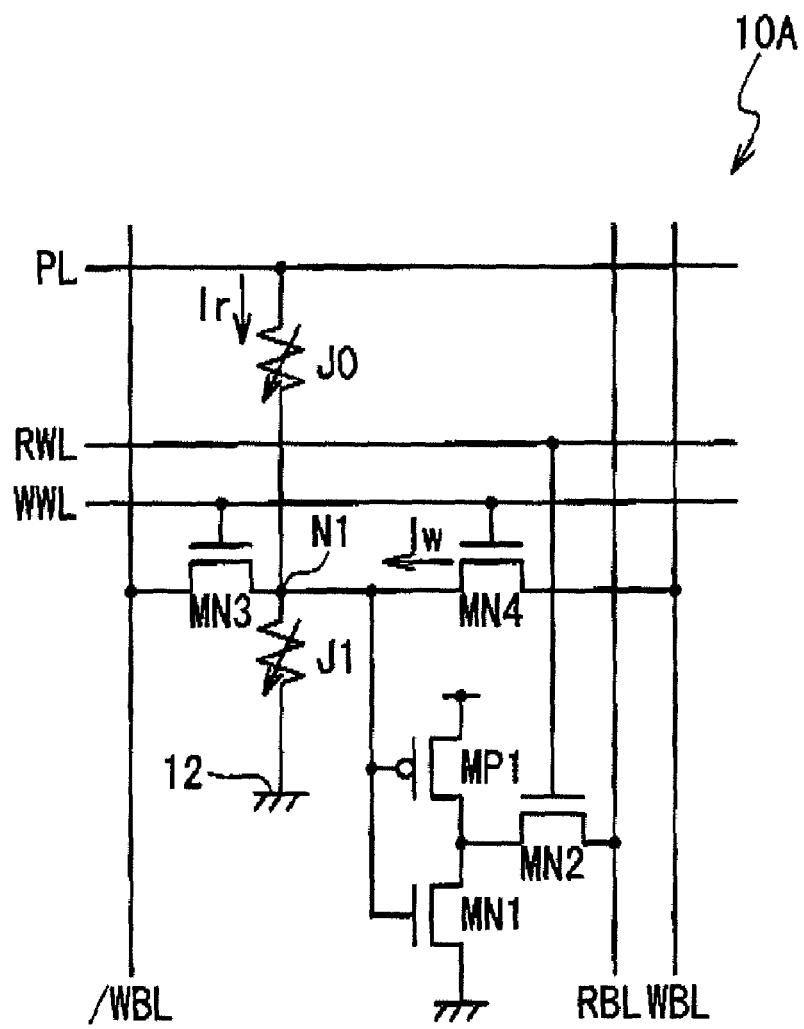
FIG. 4 is an equivalent circuit diagram showing another configuration of the MRAM memory cell in the first embodiment of the present invention.

FIG. 4 is a diagram showing an equivalent circuit of a memory cell 10A of another preferable configuration. The MRAM incorporating the memory cells of FIG. 3 suffers from an increased standby current, especially when the MRAM has an increased memory capacity, since the read current Ir constantly flows through each memory cell. In a second embodiment, the magnetoresistive element J0 of the memory cell is connected to a pull-up line PL in place of the power supply terminal 11 to reduce the standby current. In one embodiment, the pull-up line PL is activated only when the associated read word line is activated.

However, the pull-up line PL needs to be activated earlier than the read word line RWL in the read cycle, and there is a requirement of further acceleration of the speed of the activation of the pull-up line PL. Accordingly, the pull up lines PL are desirably activated in units of multiple lines or in units of blocks so as to be activated earlier than the read word line RWL, when the further acceleration is required.

Figure 19:
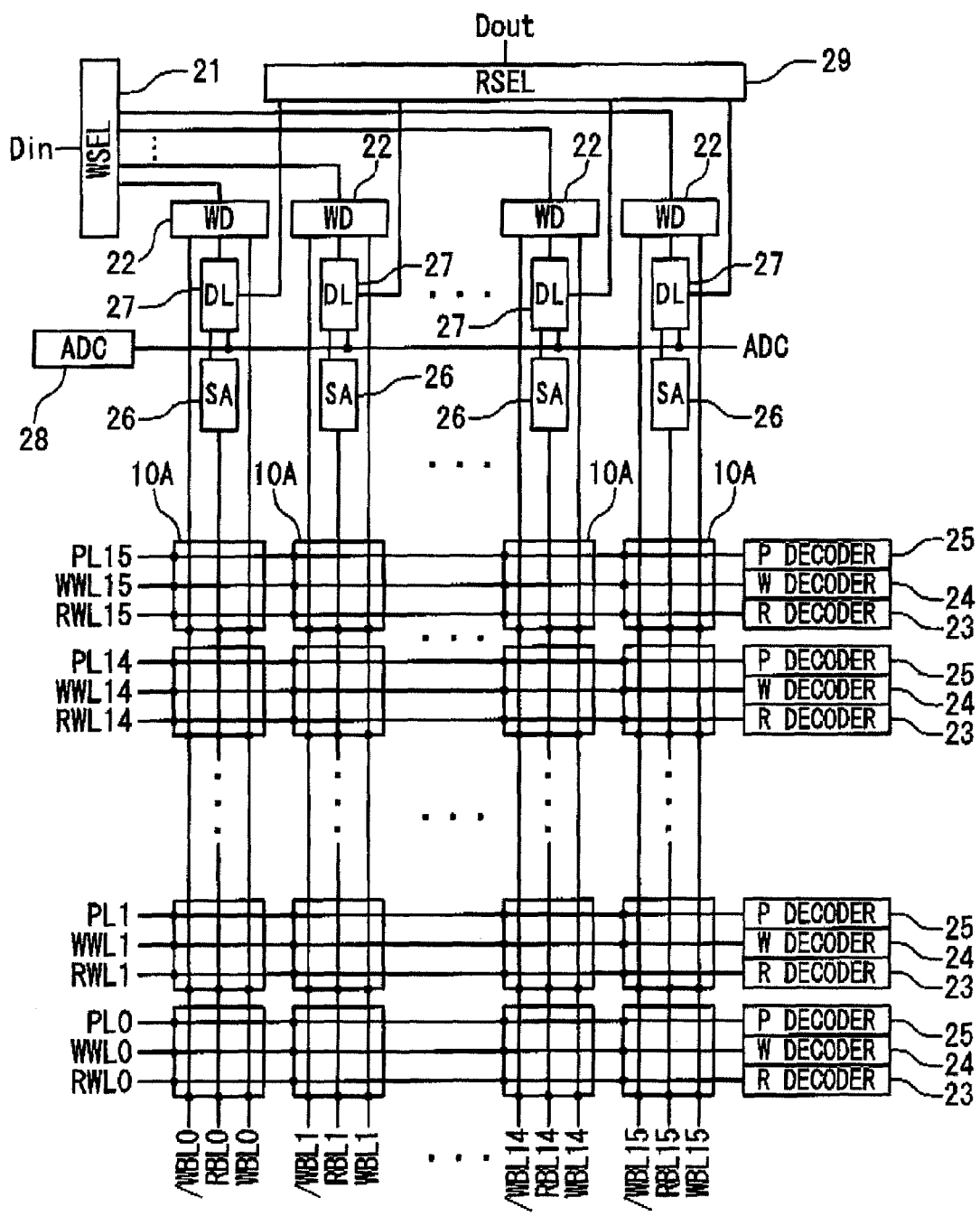
FIG. 19 is a block diagram showing the configuration of the MRAM in the first embodiment of the present invention.

FIG. 19 is a block diagram showing the configuration of a memory cell array which integrates memory cells 10A shown in FIG. 4, and peripheral circuits connected thereto. The memory cell array is provided with memory cells 10A arranged in rows and columns, complementary write bitlines /WBLi and WBLi, read bitlines RBLi, read word lines RWLj, write word lines WWLj, pull up lines PLj, a write bitline selector 21, bitline driver circuits 22, read word line decoders 23, write word line decoders 24, pull up line decoders 25, sense amplifier circuits 26, data latches 27, an address matching detection circuit 28, and a read data selector 29.

Figure 18:
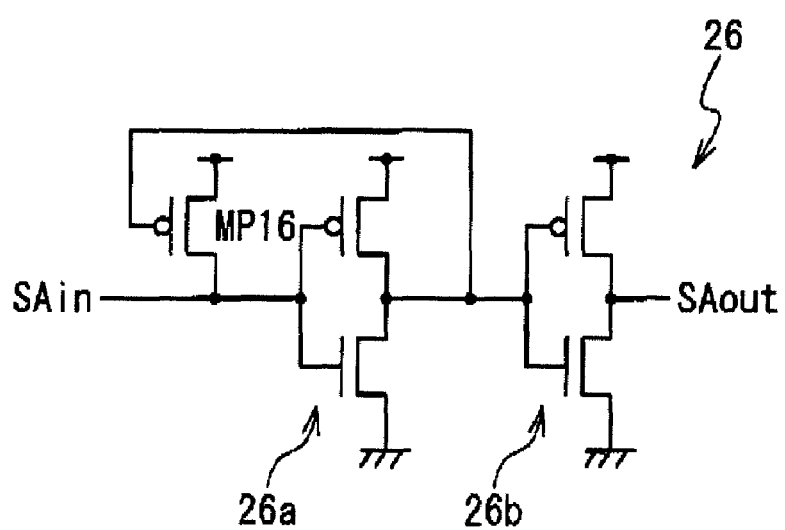
FIG. 18 is a circuit diagram showing the configuration of a sense amplifier circuit in the first embodiment.

Write data Din are provided for the bitline driver circuit 22 which drives the selected complementary bitlines /WBLi and WBLi through the write bitline selector 21. The bitline driver circuit 22 drives the bitlines /WBLi and WBLi to complementary voltage levels corresponding to the write data Din in a normal write operation. In a read operation, on the other hand, the pull-up line PLj selected by the pull up line decoder 25 and the read word line RWLj selected by the read word line decoder 23 are activated to output a signal having a signal level corresponding to data stored in the magnetoresistive elements J0 and J1 to the read bitline RBLi. The outputted signal is amplified by the associated sense amplifier circuit 26. The sense amplifier circuits 26 may be formed in a simple circuit configuration as shown in FIG. 18, for example, because the selected read bitline RBLi is driven to one selected out of voltage levels of Vdd-Vtn and Vss by the inverter incorporated in the selected memory cell 10A (that is, the PMOS transistor MP1 and the NMOS transistor MN1). It should be noted that the voltage level Vdd is a voltage level of the power supply terminal, the voltage level Vss is a voltage level of the ground terminal, and Vtn is the threshold voltage of the NMOS transistor MN2. The sense amplifier circuits 26 shown in FIG. 18 are each composed of serially connected CMOS inverters 26a and 26b in addition to include a PMOS transistor MP16 with an extremely small drive capacity. The PMOS transistor MP16 is used to recover the voltage drop caused by the threshold voltage of the NMOS transistor MN2.

Data outputted from the sense amplifier circuit 26 connected with the selected read bitline RBLi is forwarded to the associated data latch 27 so that the sense amplifier circuit 26 is prepared for the next input thereto, and data outputted from the data latch 27 is selected by the read data selector and outputted as output data Dout.

In the peripheral circuit in FIG. 19, measures are taken against a problem that the read cycle time is increased, when a write operation is followed by a read operation with a read address identical to the write address used in the write operation. More specifically, when the address matching detection circuit 28 detects that the read address is identical to the write address, the address matching detection circuit 28 activates an address match signal ADC. In response to the activation of the address match signal ADC, the data latch 27 associated with the read address receives the write data Din from the associated bitline driver circuit 22, not from the associated sense amplifier circuit 26. That is, the bitline driver circuit 22 associated with the read address writes data directly into the data latch 27 while writing the data to the associated write bitlines WBL and /WBL.

FIGS. 5A, 5B, and 6 to 11 are equivalent circuit diagrams showing other preferred configurations of the memory cells. A memory cell 10B shown in FIG. 5A incorporates an N channel depression transistor MD1 in place of the PMOS transistor MP1 of the memory cell 10A shown in FIG. 4. The memory cell 10B incorporates an inverter composed of the NMOS transistor MN1 and the N channel depression transistor MD1. This eliminates the need for forming an N well within which the PMOS transistor MP1 is integrated, and thereby allows reducing the cell size of the memory cell through process optimization.

Figure 5A:
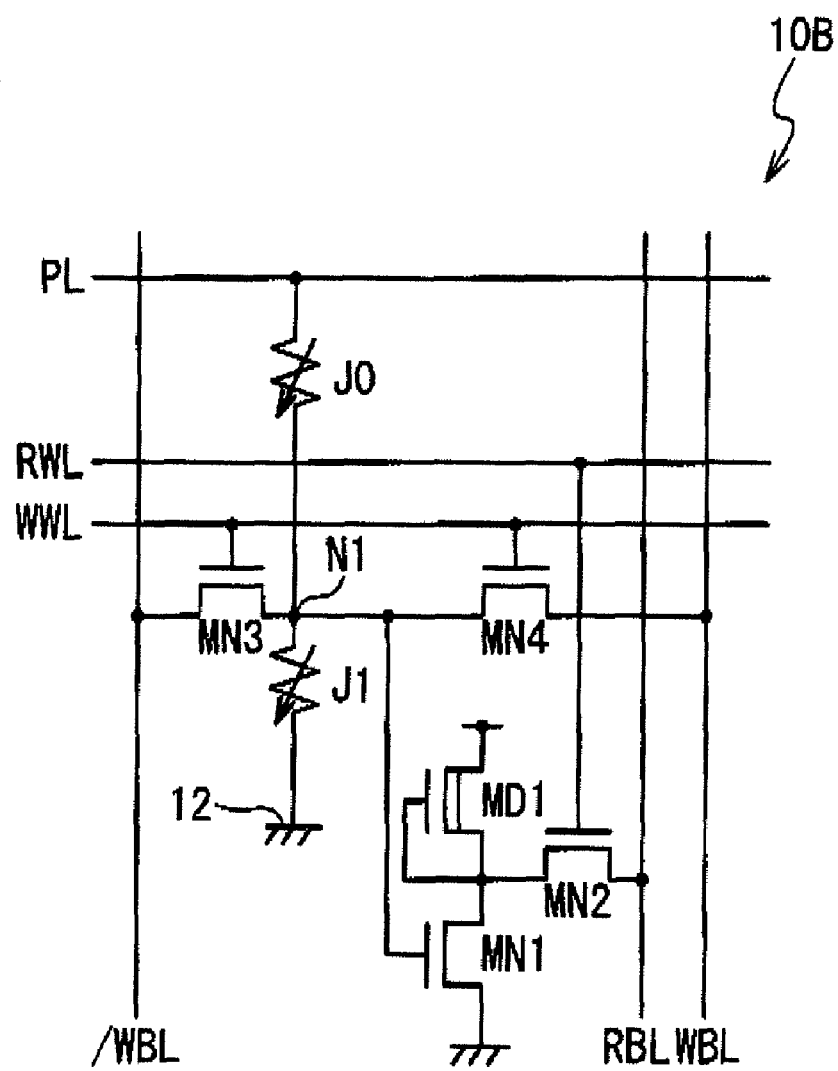
FIGS. 5A and 5B are equivalent circuit diagrams showing other configurations of the MRAM memory cell in the first embodiment of the present invention.
Figure 5B:
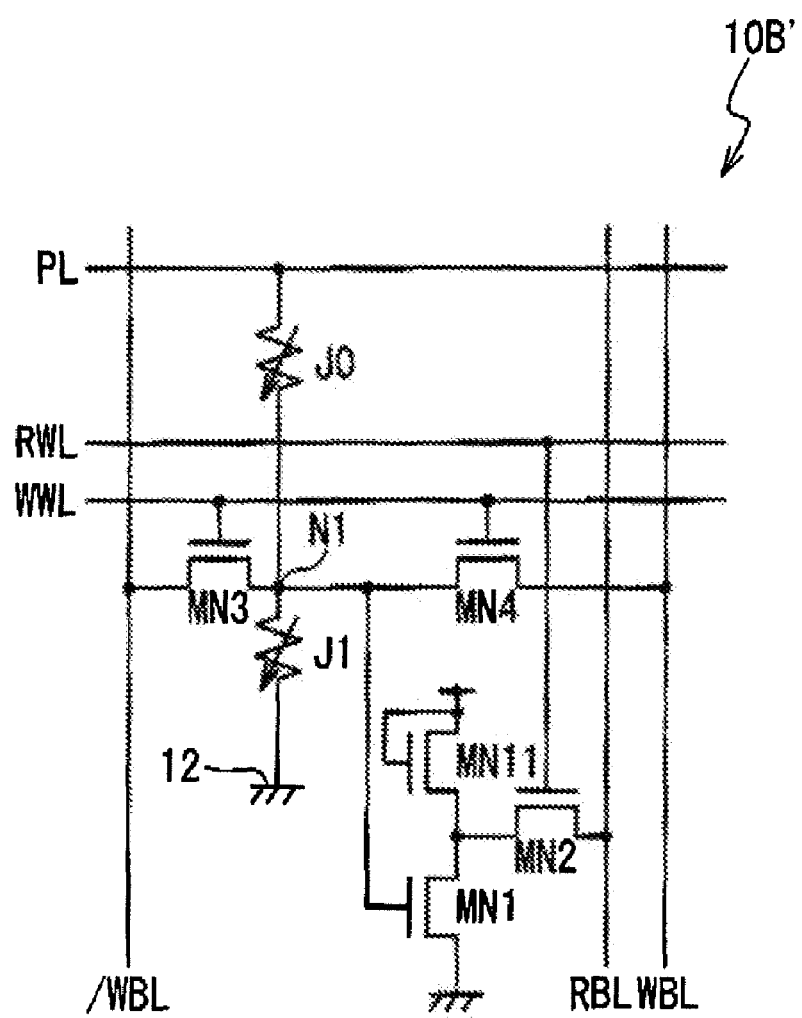

A memory cell 10B' shown in FIG. 5B has a configuration similar to that of the memory cell 10B shown in FIG. 5A. More specifically, the memory cell 10B' shown in FIG. 5B incorporates a diode-connected NMOS transistor MN11 in place of the N-channel depression transistor MD1 in the memory cell 10B of FIG. 5A. Such configuration also allows the NMOS transistors MN1 and MN11 to function as an inverter. The configuration shown in FIG. 5B also allows reducing the cell size of the memory cell, since an N well within which the PMOS transistor MP1 is formed is not required in the memory cell 10B' in FIG. 5B. Although the amplitude of the output signal from the inverter is decreased, the configuration shown in FIG. 5B has an advantage that the memory cell 10B' in FIG. 5B only consists of normally-structured MOS transistors, excluding a depletion transistor.

Figure 6:
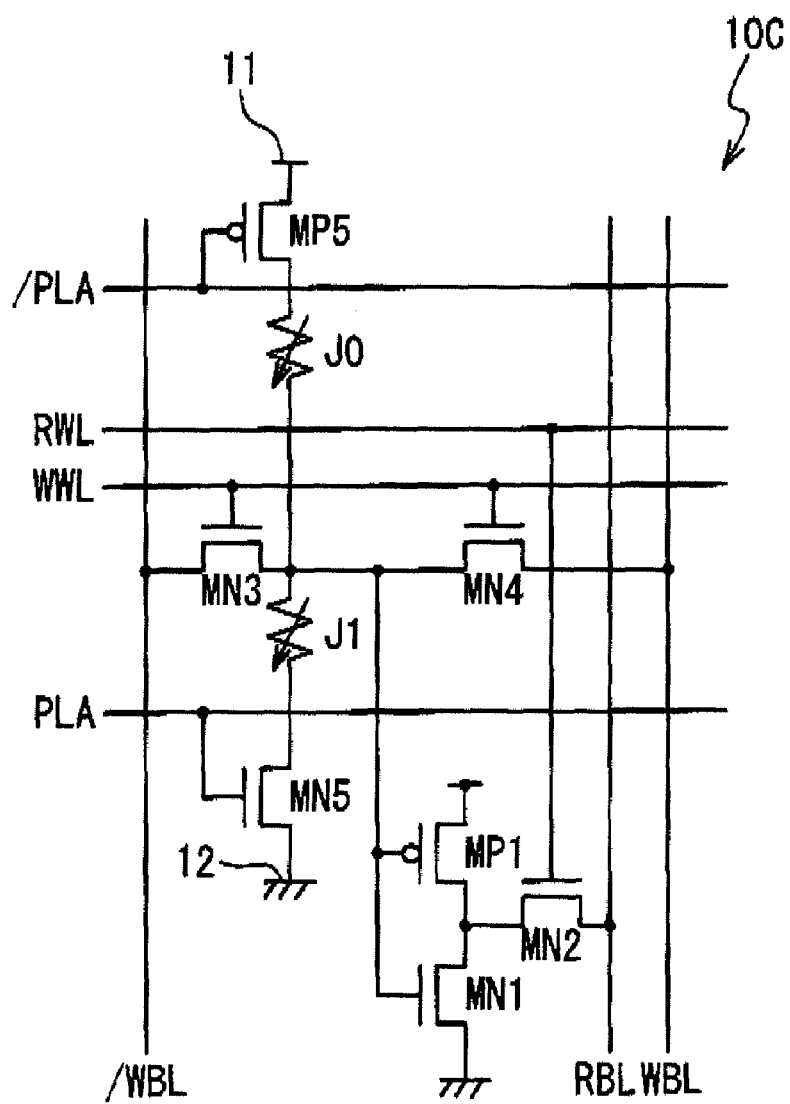
FIG. 6 is an equivalent circuit diagram showing another configuration of the MRAM memory cell in the first embodiment of the present invention.

In a memory cell 10C in FIG. 6, switch elements, specifically a PMOS transistor MP5 and an NMOS transistor MN5, are inserted in a current path of the read current Ir in order to prevent the constant flow of the read current Ir. Although the insertion of the switch elements increases the cell size, this allows the rising of a current to be accelerated through layout optimization.

Figure 7:
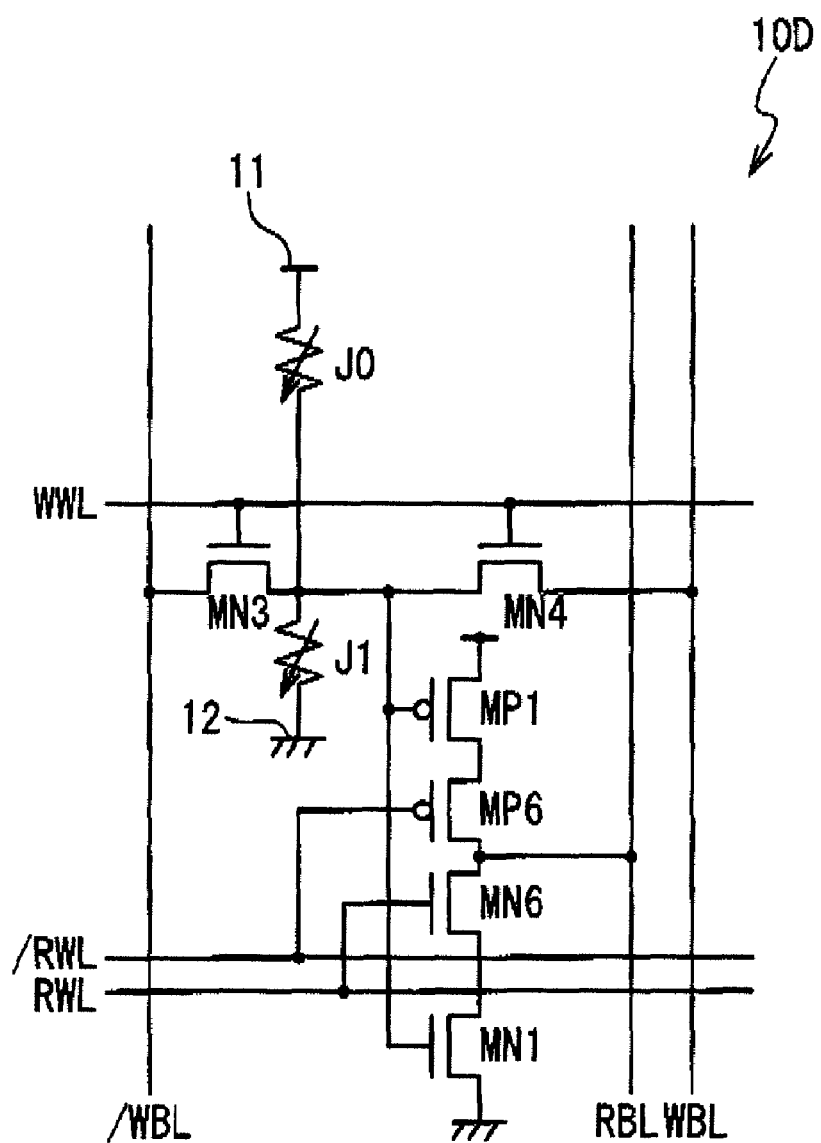
FIG. 7 is an equivalent circuit diagram showing another configuration of the MRAM memory cell in the first embodiment of the present invention.

In a memory cell 10D in FIG. 7, a clocked inverter architecture is employed instead of using the NMOS transistor MN2, which functions as a transfer switch, so that the output transistors are separated from the read bitline RBL at the time other than read operations. More specifically, an NMOS transistor MN6 and a PMOS transistor MP6 are added to the inverter incorporated in the memory cell 10D. Although the cell size is therefore increased, a CMOS-level output signal is outputted from the memory cell 10D, which has a signal level selected out of the power source level and the ground level). This allows simplifying the configuration of the sense amplifier circuits 26. Although FIG. 7 shows the configuration in which the magnetoresistive element J0 is connected with the power supply terminal 11 in the same manner as the memory cell 10 in FIG. 3, it should be noted that the configuration in which the magnetoresistive element J0 is connected with the pull-up line PL may be employed in the same manner as the memory cell 10 in FIG. 4.

Figure 8:
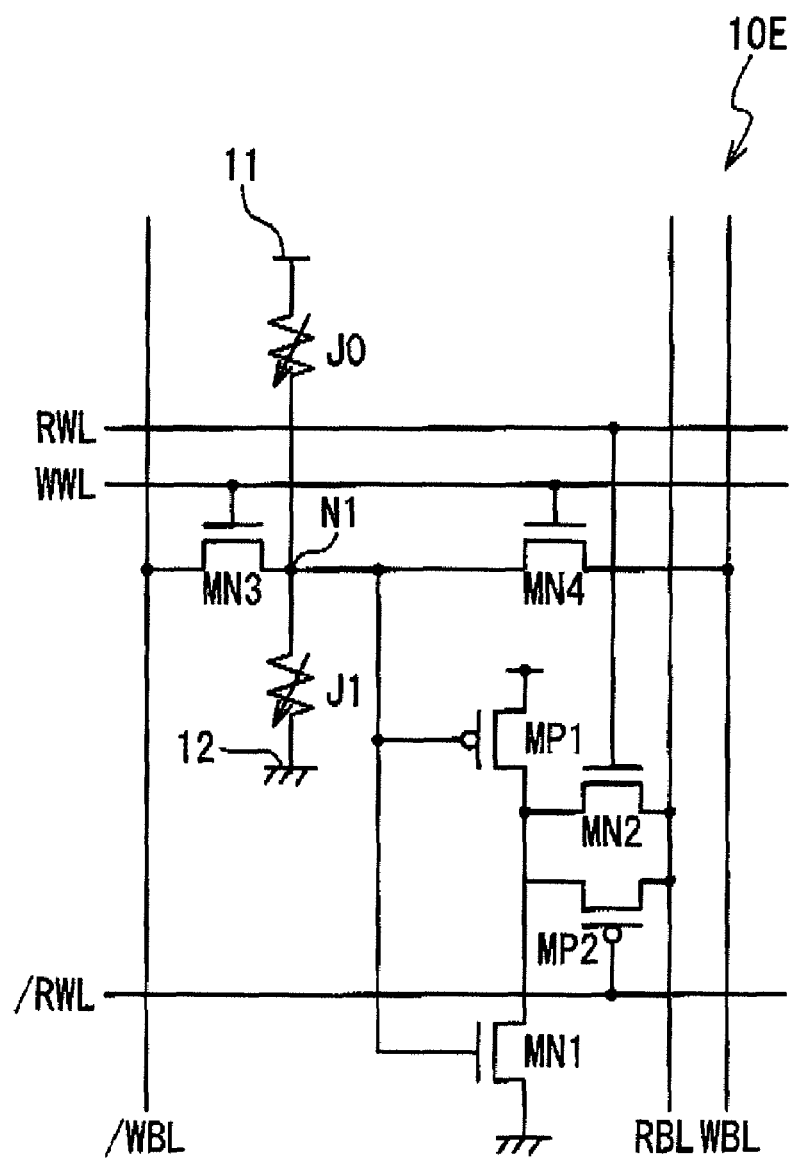
FIG. 8 is an equivalent circuit diagram showing another configuration of the MRAM memory cell in the first embodiment of the present invention.

In a memory cell 10E in FIG. 8, added is a PMOS transistor MP2 connected in parallel with the NMOS transistor MN2. Although the cell size is also increased, the configuration shown in FIG. 8 allows outputting a CMOS-level output signal from the memory cell 10E, and thereby allows simplifying the configuration of the sense amplifier circuits 26.

Although FIG. 8 shows the configuration in which the magnetoresistive element J0 is connected with the power supply terminal 11 in the same manner as the memory cell 10 in FIG. 3, it should be noted that the configuration in which the magnetoresistive element J0 is connected with the pull-up line PL may be employed in the same manner as the memory cell 10 in FIG. 4.

Figure 9:
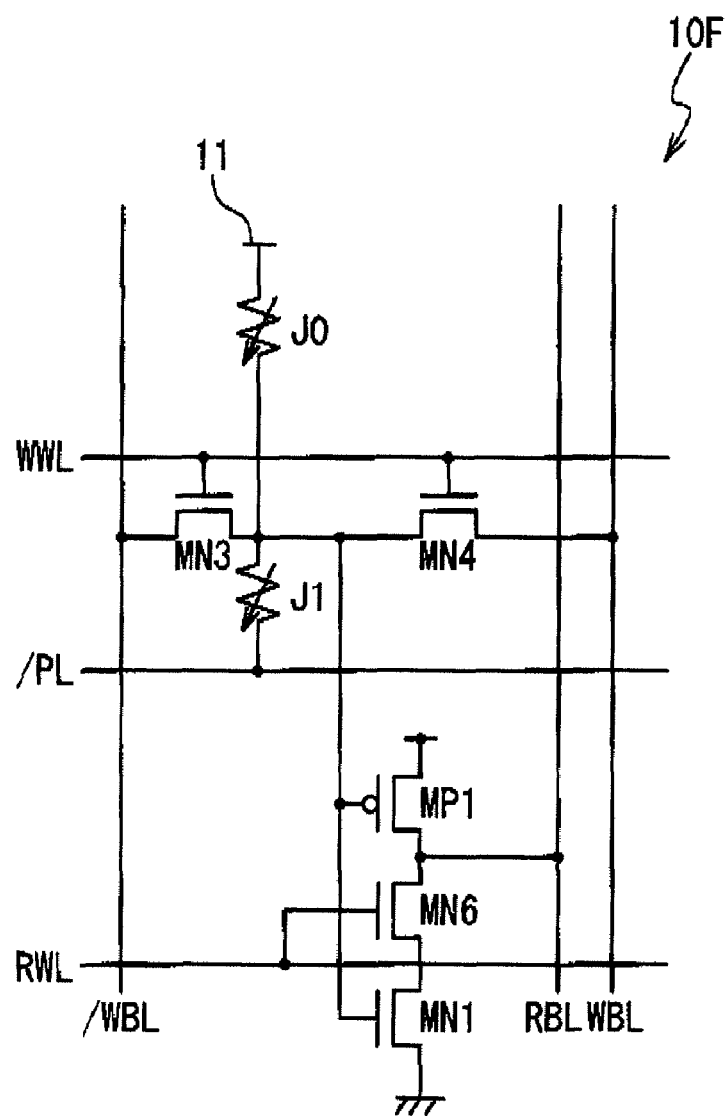
FIG. 9 is an equivalent circuit diagram showing another configuration of the MRAM memory cell in the first embodiment of the present invention.
Figure 10:
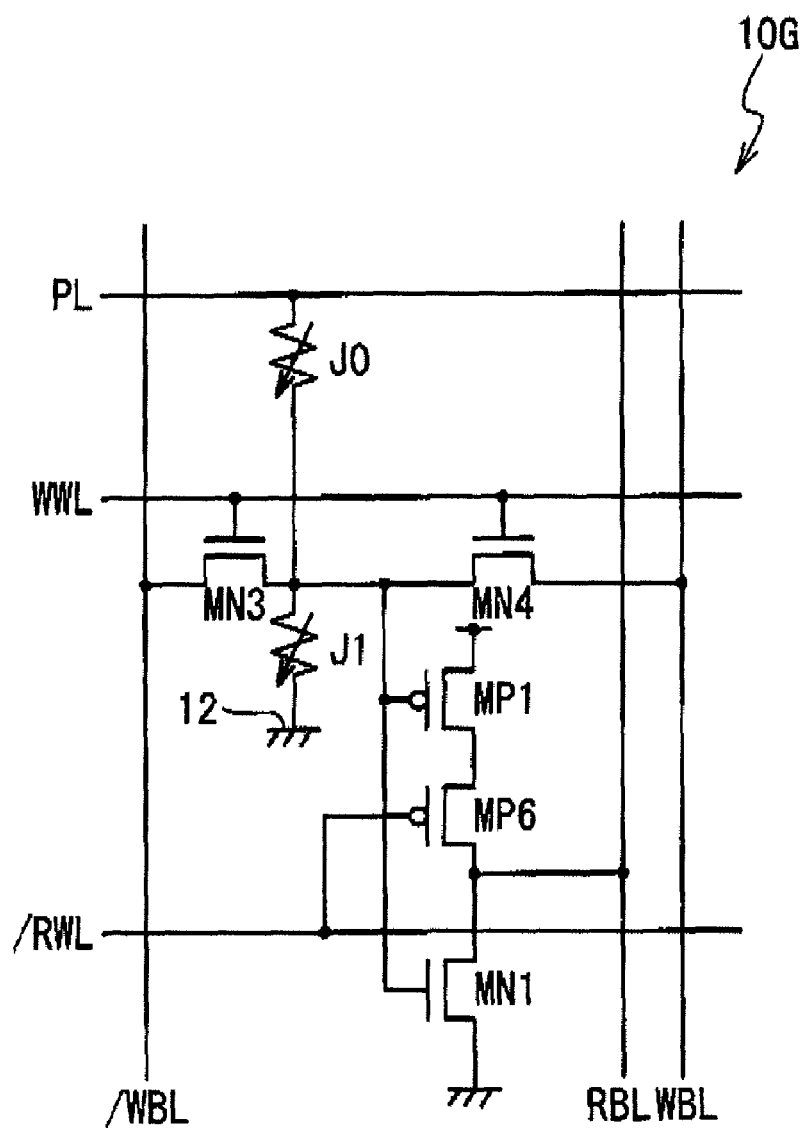
FIG. 10 is an equivalent circuit diagram showing another configuration of the MRAM memory cell in the first embodiment of the present invention.

Memory cells 10F and 10G shown in FIGS. 9 and 10 have clocked-inverter configurations improved from the clocked-inverter configuration shown in FIG. 7. In the memory cell 10F in FIG. 9, a pull-down line /PL which is pulled down at the time of activation is connected to the magnetoresistive element J1. Further more, the PMOS transistor MP6 is removed from the memory cell 10F on the basis of the fact that the cell node N1 is pulled up to the high level at the time of activation. The configuration shown in FIG. 9 allows outputting a CMOS-level output signal from the memory cell 10F, and thereby realizes simplification of the sense amplifier circuits 26, while the cell size is not increased in comparison with the memory cell 10 in FIG. 3. In the memory cell 10G shown in FIG. 10, on the other hand, the pull-up line PL which is pulled up at the time of activation is used so as to remove the NMOS transistor MN 6. The configuration shown in FIG. 10 also allows simplifying the configuration of the sense amplifier circuits 26, while the cell size is not increased in comparison with the memory cell 10 in FIG. 3, as is the case of the memory cell 10F in FIG. 9.

Figure 11:
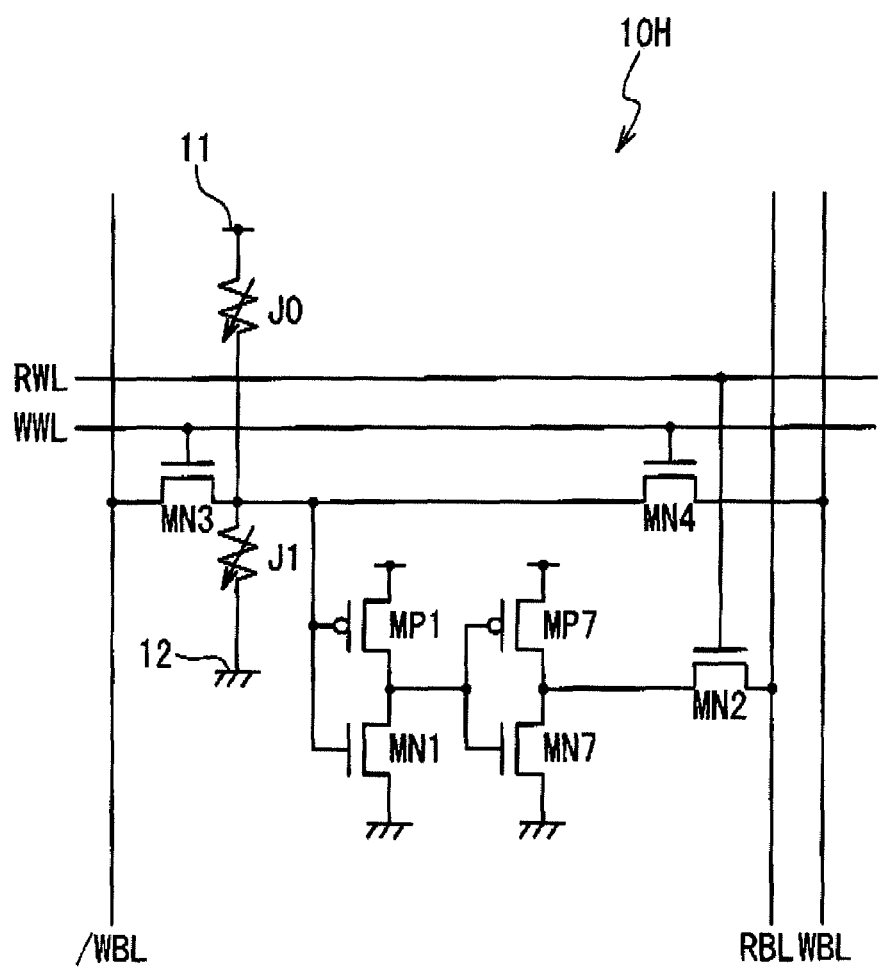
FIG. 11 is an equivalent circuit diagram showing another configuration of the MRAM memory cell in the first embodiment of the present invention.

In a memory cell 10H shown in FIG. 11, incorporated are a pair of serially-connected inverters. That is, in addition to the inverter composed of the PMOS transistor MP1 and the NMOS transistor MN1, an additional inverter composed of a PMOS transistor MP7 and an NMOS transistor MN7 is incorporated in the memory cell 10H. In this memory cell 10H, a signal outputted from the magnetoresistive elements J0 and J1 is amplified by the serially-connected inverters and the amplified signal is outputted to the read bitline RBL. Although increasing the cell size, the amplification using the serially-connected inverters allows acceleration of the read operation, especially when the signal obtained from the magnetoresistive elements J0 and J1 suffers from small signal level.

Figure 15:
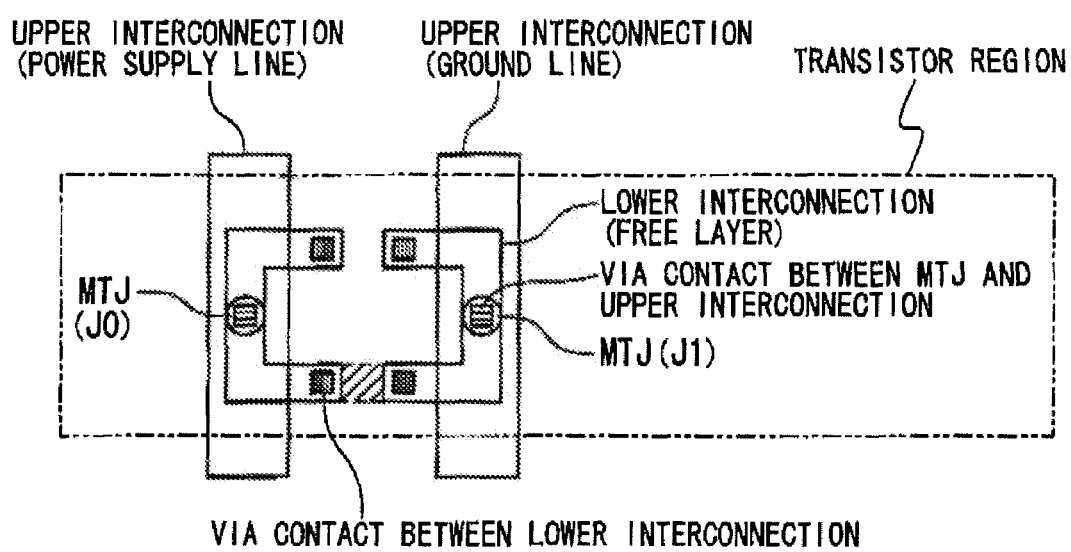
FIG. 15 is an upper surface diagram showing another configuration of the MRAM memory cell in the first embodiment of the present invention.
Figure 16A:
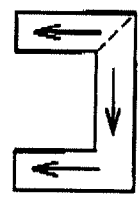
FIG. 16A is a plane diagram showing the other configuration of the MRAM memory cell in the first embodiment of the present invention.
Figure 16B:
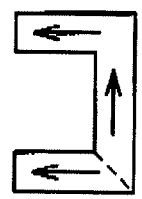
FIG. 16B is a plane diagram showing the other configuration of the MRAM memory cell in the first embodiment of the present invention.
Figure 17:
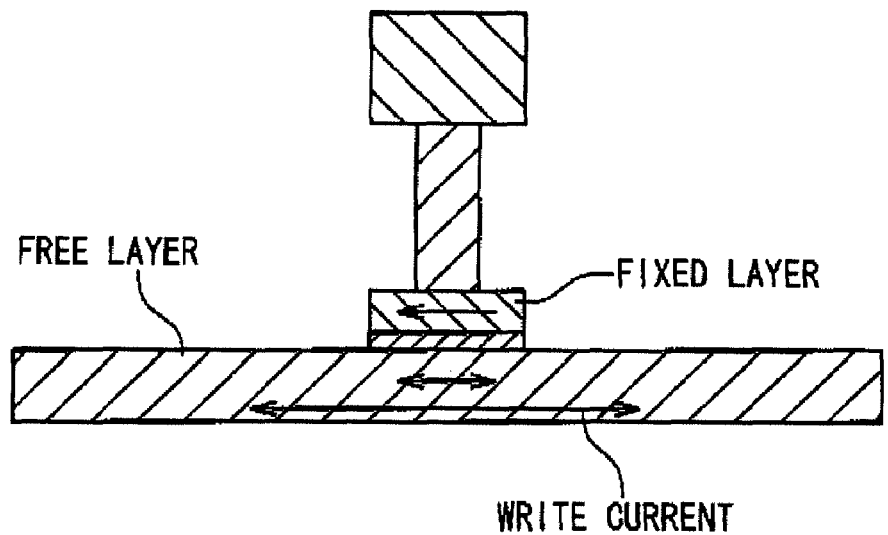
FIG. 17 is an enlarged cross sectional diagram showing the other configuration of the MRAM memory cell in the first embodiment of the present invention.

FIGS. 15, 16A, 16B and 17 are diagrams showing examples of the modified configuration of the memory cell. FIG. 15 is an upper surface diagram of the memory cell. The configuration of the transistor region is the same with the configuration shown in FIGS. 12, 13 and 14. In the configuration shown in FIGS. 15, 16A, 16B and 17, the free layer of the magnetoresistive elements J0 and J1 have a configuration different from that shown in FIGS. 12, 13 and 14. Referring to FIGS. 16A and 16B, a magnetic domain wall is generated in the free layer at a position selected out of two positions complementary relationship, so that complementary data of "1" and "0" are recorded in the magnetoresistive elements J0 and J1 as the position of the magnetic domain wall. Data are written by moving the magnetic domain wall with a current flow through an interconnection that is used as both of the free layer and the data write interconnection. It should be noted that it is well-known in the art that the magnetic domain wall can be pushed and moved by applying a current. Data read is achieved by using fixed layers formed over the free layer; the resistances of the MTJs formed between the respective fixed layers and the free layer change depending on the position of the magnetic domain wall. It should be noted that the free layer also functions as the data write interconnection. FIG. 17 is a cross sectional diagram showing the memory cell structure in the vicinity of the magnetoresistive elements J0 and J1. Although there is slight difference, the data write operation for the memory cell configuration shown in FIGS. 15, 16A, 16B and 17 is similar to that of the configuration shown in FIGS. 12, 13 and 14 in the fact that the current flow through the cell node N1 achieves data write into both of the two free layers remains the same. Data read is achieved in substantially the same manner.

Second Embodiment

Figure 21:
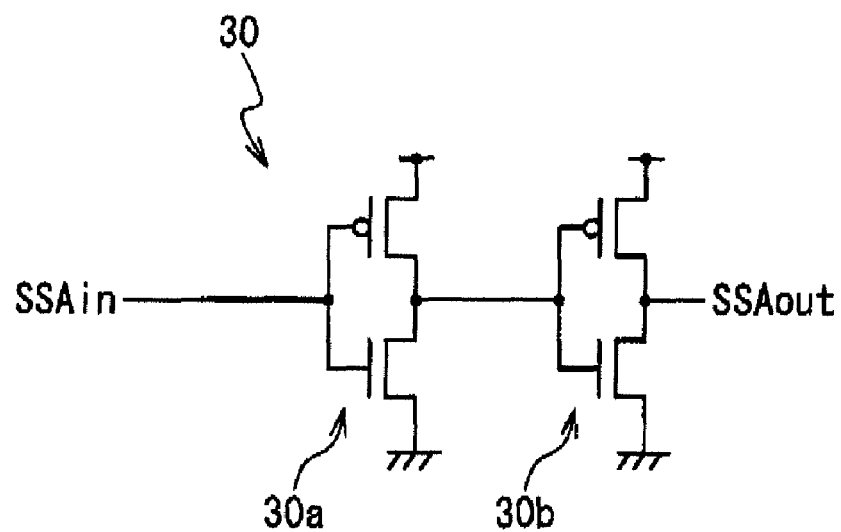
FIG. 21 is a circuit diagram showing the configuration of a sub sense amplifier circuit in the second embodiment.
Figure 22:
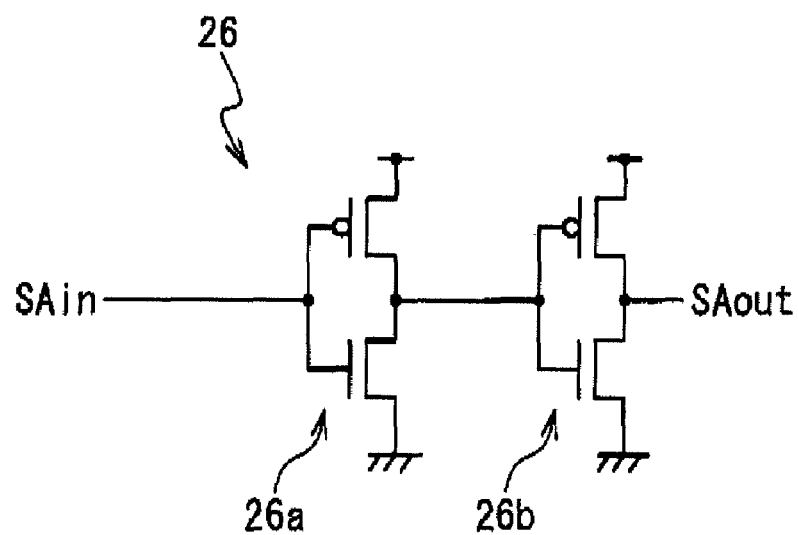
FIG. 22 is a circuit diagram showing the configuration of a sense amplifier circuit in the second embodiment.
Figure 23:
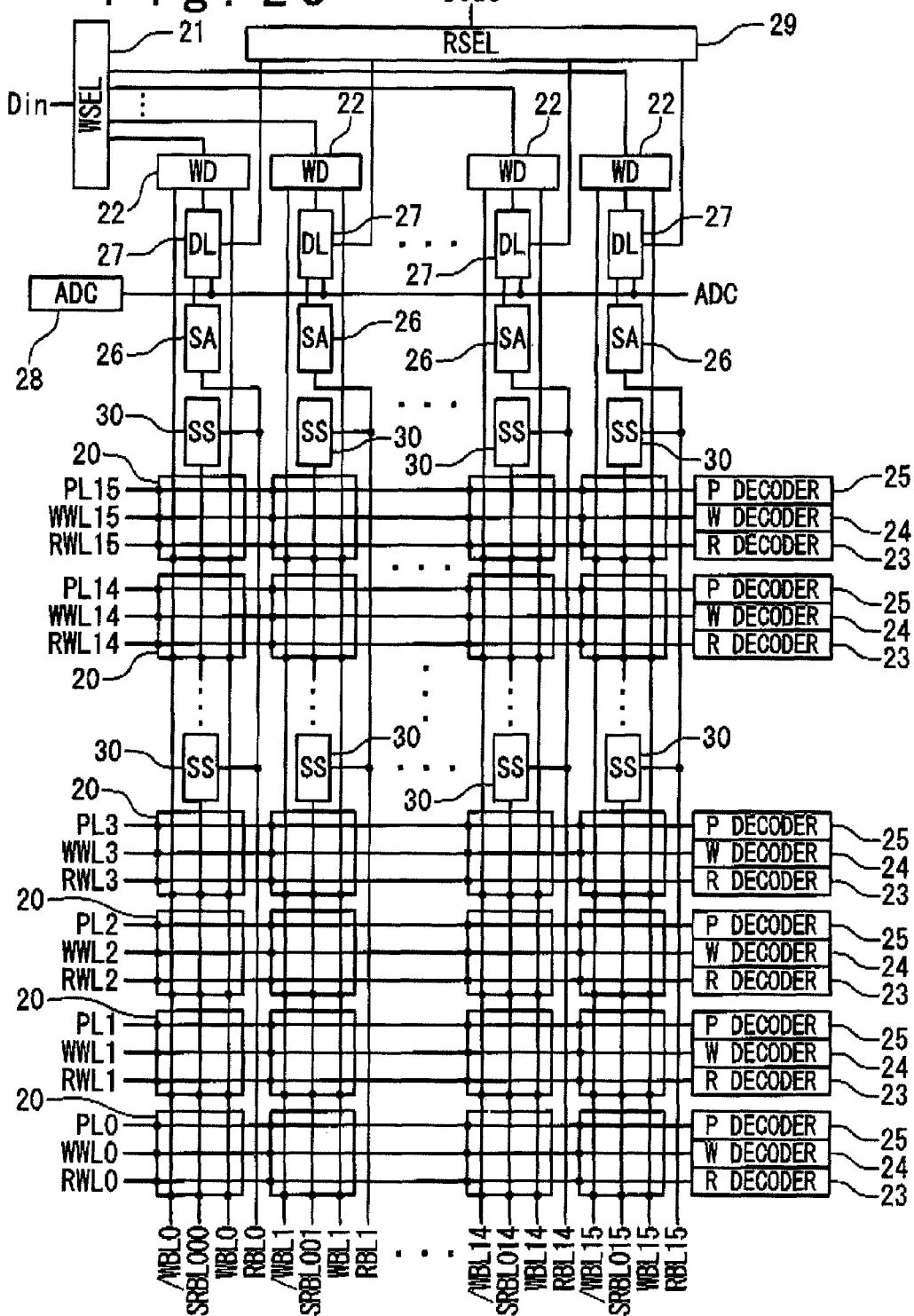
FIG. 23 is a block diagram showing the configuration of the MRAM in the second embodiment of the present embodiment.

FIGS. 20 to 23 are diagrams showing the configuration of an MRAM in a second embodiment of the present invention. Differently from the MRAM in the first embodiment, which incorporates an inverter for signal amplification within each memory cell, the MRAM in the second embodiment additionally incorporates sub-sense amplifier circuits 30 each amplifying a signal obtained from the magnetoresistive elements J0 and J1. One sub-sense amplifier circuit 30 is provided for multiple memory cells 20; FIG. 23 shows the configuration in which one sub-sense amplifier circuit 30 is provided for every four memory cells 20. The sub-sense amplifier circuits 30 are arranged in rows and columns in the memory array of in the memory cells 20.

The memory cells 20 associated with the same sub-sense amplifier circuit 30 are commonly connected to a sub bitline SRBLi. The sub-sense amplifier circuits 30 are designed to output an output signal corresponding to the data stored in the memory cell 20 subjected to the read operation in response to the voltage level on the sub bitline SRBLi.

The outputs of the sub-sense amplifier circuit 30 are connected to the sense amplifier circuits 26. More specifically, the outputs of the sub-sense amplifier circuits 30 associated with the same column of the memory cells 20 are commonly connected to the same sense amplifier circuit 26 through a read bitline RBLi. Each sense amplifier circuit 26 is designed to identify the data stored in the selected memory cell 20 on the basis of the output from the associated sub sense amplifier circuit 30.

Figure 20:
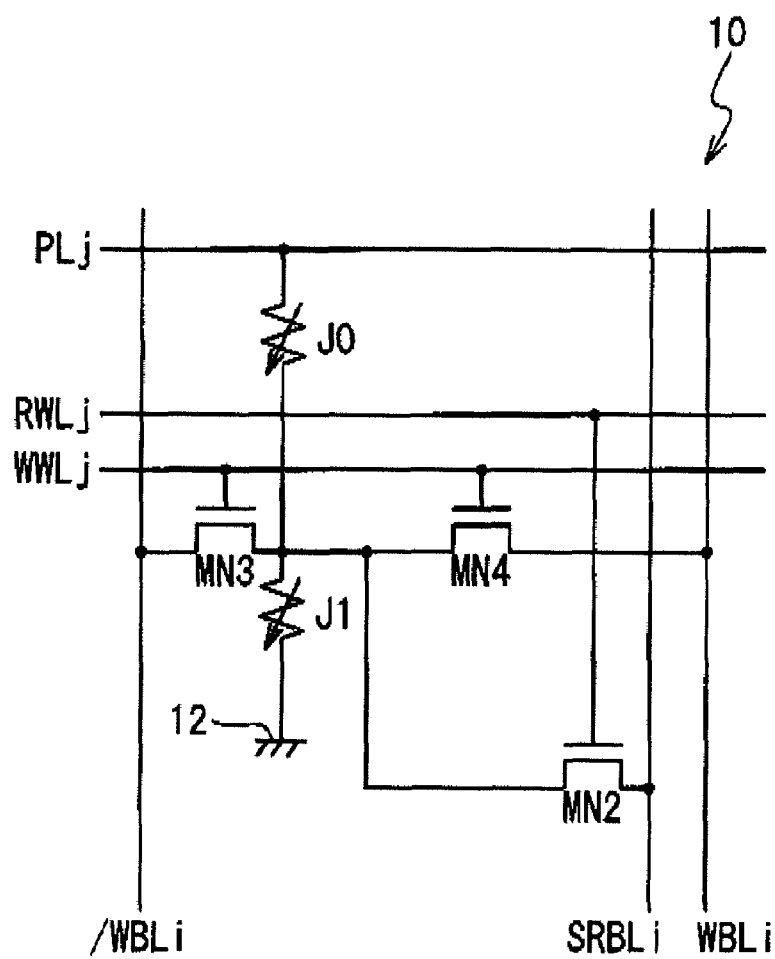
FIG. 20 is an equivalent circuit diagram showing the configuration of a memory cell of an MRAM in a second embodiment of the present invention.

FIG. 20 is an equivalent circuit diagram showing the configuration of each memory cell 20. The configuration of the memory cell 20 shown in FIG. 20 is similar to the configuration of the memory cell 10A in FIG. 4. The difference is that the inverter is excluded from the memory cell 20. The NMOS transistor MN2 is connected between the sub bitline SRBLi and the cell node N1. It should be noted that the NMOS transistor MN2 is directly connected to the cell node N1.

FIG. 21 is a circuit diagram showing the configuration of the sub-sense amplifier circuits 30. Commonly-known inverters may be used as the sub sense amplifier circuits 30; the sub-sense amplifier circuit 30 shown in FIG. 21 is composed of a pair of serially-connected inverters 30a and 30b.

FIG. 22 is a circuit diagram showing the configuration of the sense amplifier circuits 26. Commonly-known inverters inverter can be used as the sense amplifier circuits 26 as is the case of the sub sense amplifier circuits 30; the sense amplifier circuit 26 shown in FIG. 22 is composed of a pair of serially-connected inverters 26a and 26b.

The hierarchical structure of the memory cell array shown in FIG. 23 is effective to reduce the cell area in comparison with the MRAM in the first embodiment. In addition, each sub bitline SRBLj has a reduced load of only four memory cells. Accordingly, the hierarchical memory array structure shown in FIG. 23 effectively reduces the overhead of the read operation speed caused by the small drive capability of each memory cell.

Third Embodiment

Figure 24:
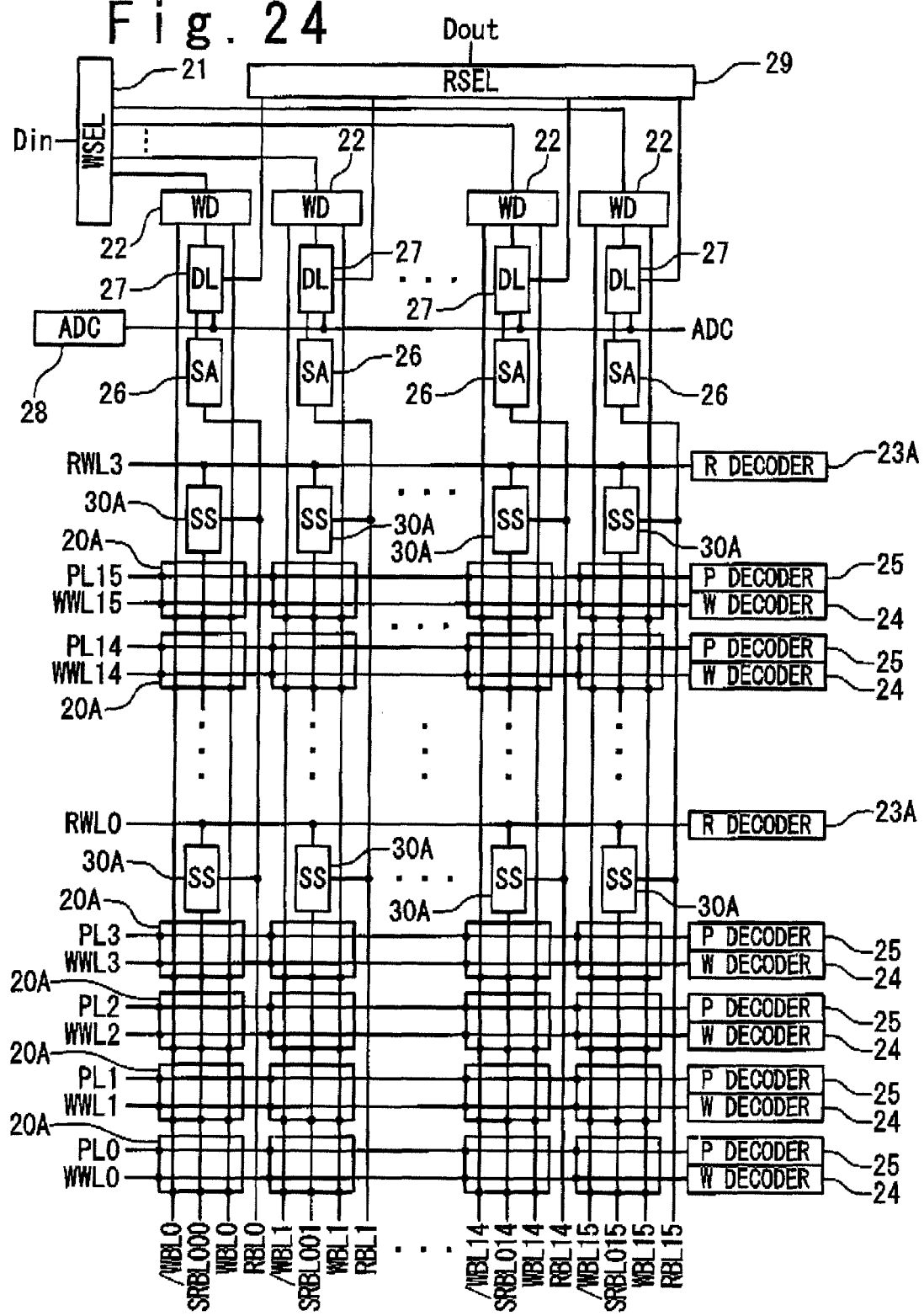
FIG. 24 is a block diagram showing the configuration of an MRAM in a third embodiment.

FIG. 24 is a block diagram showing the configuration of an MRAM in a third embodiment of the present invention. The MRAM in the third embodiment has a configuration substantially similar to that in the second embodiment. A plurality of memory cells 20A provided in the same column are commonly connected to the same sub sense amplifier circuit 30A, and a plurality of sub sense amplifier circuits 30A provided in the same column are commonly connected to the same sense amplifier circuit 26.

Figure 25:
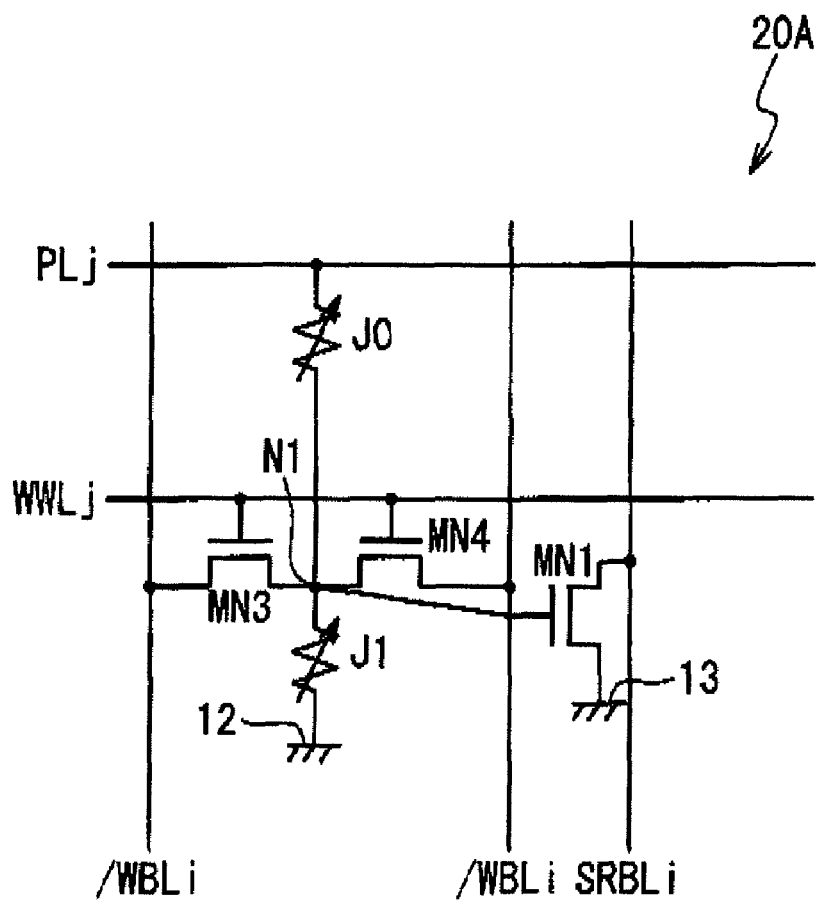
FIG. 25 is a circuit diagram showing the configuration of a memory cell in the third embodiment.

The difference is that the memory cells 20A and the sub sense amplifier circuits 30A are structured differently from those of the memory cells 20 and the sub sense amplifier circuits 30 of the MRAM in the second embodiment, and that a read word line RWLj is provided for each row of the sub sense amplifier circuits 30A (not for each row of the memory cells 20A) The circuit structure shown in FIG. 18 is used for the sense amplifier circuits 26. It should be noted that inputs SAin of the respective sense amplifier circuits 26 can be pulled up to the voltage level Vdd by the PMOS transistor MP16 in the configuration of the sense amplifier circuits 26 shown in FIG. 18, FIG. 25 is a circuit diagram showing the configuration of the memory cells 20A in the third embodiment. The memory cells 20A each includes a pair of magnetoresistive elements J0 and J1 incorporating MTJs therein, and NMOS transistors MN1, MN3 and MN4. The magnetoresistive element J0 is connected between a pull-up line PLj and a cell node N1, while the magnetoresistive element J1 is connected between the cell node N1 and a ground terminal 12. The NMOS transistor MN3 is connected between the cell node N1 and the write bitline /WBLi, while the NMOS transistor MN4 is connected between the cell node N1 and the write bitline WBLi. The gates of the NMOS transistors MN3 and MN4 are commonly connected to a write word line WWLj, so that the NMOS transistors MN3 and MN4 function as switch elements providing electrical connection between the cell node N1 and the write bitlines /WBLi and WBLi in response to activation of the write word line WWLj. The gate of the NMOS transistor MN1 is connected to the cell node N1, and the source thereof is connected to the ground terminal 13. The drain of the NMOS transistor MN1 is connected to a sub bitline SRBLi. As it will be understood from FIG. 24, the drain of the NMOS transistor MN1 is connected to a sub-sense amplifier circuit 30A through the sub bitline SRBLi.

Figure 26:
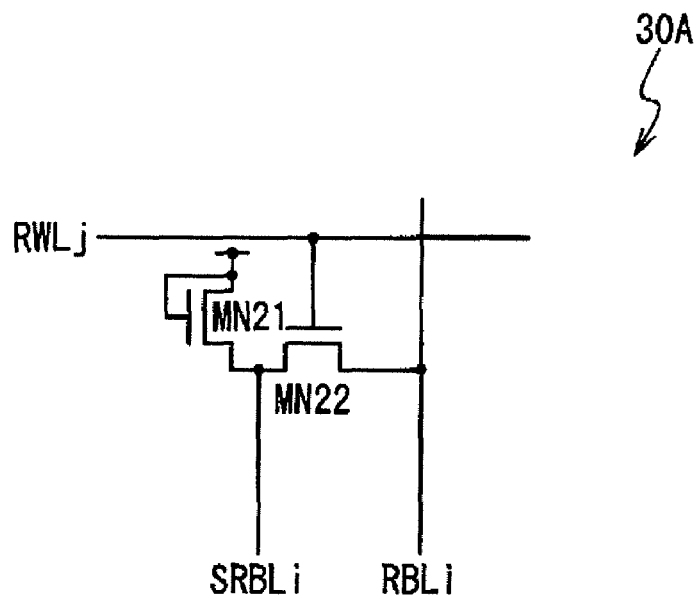
FIG. 26 is a circuit diagram showing the configuration of a sub sense amplifier circuit in the third embodiment.

FIG. 26 is a circuit diagram showing an exemplary configuration of the sub-sense amplifier circuits 30A. The sub-sense amplifier circuits 30A shown in FIG. 26 each include a pair of NMOS transistors MN21 and MN22. The NMOS transistor MN21 is diode-connected, the drain and the gate thereof are connected to a power supply terminal of the power supply level Vdd, while the source thereof connected to the sub bitline SRBLi. The gate of the NMOS transistor MN22 is connected to the read word line RWLj, so that the sub bitline SRBLi and the read bitline RBLi are electrically connected or separated in response to a voltage level of the read word line RWLj.

Figure 27:
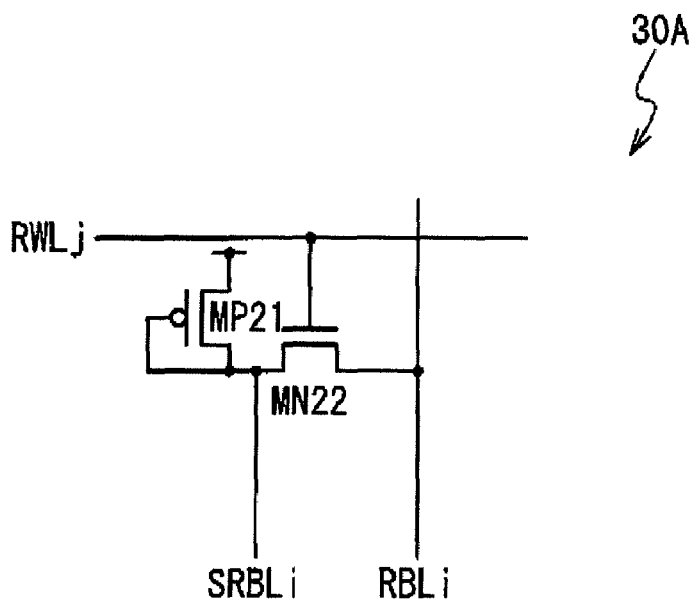
FIG. 27 is a circuit diagram showing another configuration of the memory cell in the third embodiment.
Figure 28:
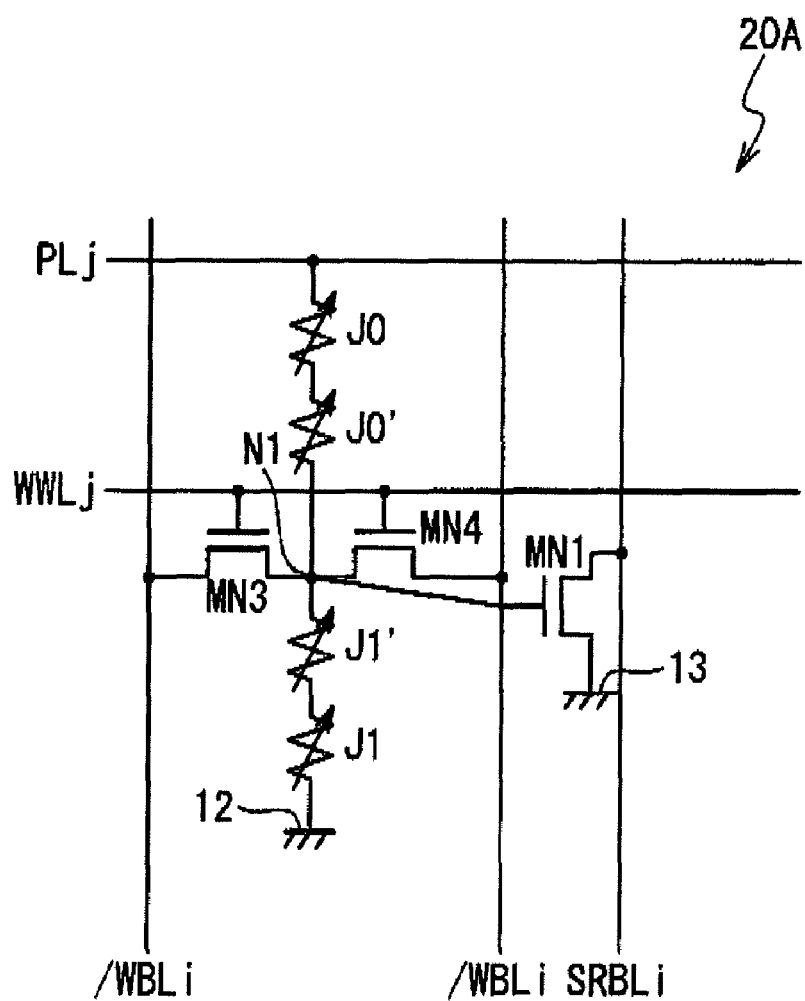
FIG. 28 is a circuit diagram showing another configuration of the memory cell in the third embodiment.

As shown in FIG. 27, a diode-connected PMOS transistor MP21 is incorporated in place of the diode-connected NMOS transistor MN21. In this case, the drain and the gate of the PMOS transistor MP21 are connected to the sub bitline SRBLi, while the source of the PMOS transistor MP21 is connected to the power supply terminal having the power supply level Vdd.

The write operation of the MRAM in this embodiment is performed as follows. A word line WWLj is selected in response to the write address, and the selected word line WWLj is activated, that is, pulled up to the high level (or the power source level Vdd). In response to the activation of the selected word line WWLj, the NMOS transistors MN3 and MN4 in the selected memory cell 20A are turned on. All of the pull-up plate lines PLj within the memory array are sustained at the ground level Vss. Furthermore, the associated bitline driver circuit 22 drives one of the write bitlines WBLj and /WBLj associated with the selected memory cell 20A up to the high level and the other down to the low level. It is determined depending on the write data which one of the write bitlines WBLj and /WBLj is driven to the high level or the low level. When the write bitlines WBLj and /WBLj are driven to desired voltage levels, a write current is generated through the magnetoresistive elements J0 and J1 within the selected memory cell 20A, so that complementary data are written into the magnetoresistive elements J0 and J1.

On the other hand, the read operation of the MRAM in this embodiment is performed as follows. All of the write word lines WWLj within the memory array are pulled down to the ground level Vss, and the NMOS transistors MN3 and MN4 in the respective memory cells 20A are turned off. As a result, the magnetoresistive elements J0 and J1 are separated from the write bitlines WBLj and /WBLj. Furthermore, a pull-up line PLj is selected in response to the read address, and the selected pull-up line PLj is pulled up to the power source level Vdd. This causes a read current to be generated through the magnetoresistive elements J0 and J1 in the selected memory cell 20A. The read current through the magnetoresistive elements J0 and J1 drives the voltage level Vs of the cell node N1 (specifically, the voltage level of the gate of the NMOS transistor MN1) to a voltage level $V_H$ which is higher than a voltage level of Vdd/2, or a voltage level $V_L$ which is lower than the voltage level of Vdd/2, in response to complementary data stored in the magnetoresistive elements J0 and J1. With respect to a non-selected memory cell 20A, on the other hand, the pull-up line PLj is pulled down to the ground level Vss, and the gate of the NMOS transistor MN1 is driven to the ground level Vss. Accordingly, the NMOS transistor MN1 is turned off.

The NMOS transistor MN1 in the selected memory cell 20A and the NMOS transistor MN21 (or the PMOS transistor MP21) in the associated sub-sense amplifier circuit 30A function as a source-grounded amplifier circuit. The source-grounded amplifier circuit amplifies the change in the voltage level Vs on the gate of the NMOS transistor MN1 around the voltage level of Vdd/2 so as to generate a read signal having a signal level ranging between the voltage level of Vss and the voltage level of Vdd-Vth, and the read signal is provided for the selected sub bitline SRBLj.

Furthermore, the read word line RWLj connected to the sub-sense amplifier circuit 30A associated with the selected memory cell 20A is activated, so that the NMOS transistor MN22 of the associated sub-sense amplifier circuit 30A is turned on. As a result, the read signal is transmitted from the sub bitline SRBLj to the read bitline RBLi. The read signal outputted to the read bitline RBLi is amplified to the logic amplitude by the sense amplifier circuit 26. It should be noted that the input SAin of the sense amplifier circuit 26 can be pulled up to the voltage level Vdd by the PMOS transistor MP16 as shown in FIG. 18.

When data "0" is read from the selected memory cell 20A (when the magnetoresistive element J1 has a relatively low resistance while the magnetoresistive element J0 has a relatively high resistance), for example, the voltage level Vs of the gate of the NMOS transistor MN1 is decreased below the voltage level Vdd/2, and the NMOS transistor MN1 in the selected memory cell 20A is substantially placed into the off state. At this time, the NMOS transistor MN21 (or the PMOS transistor MP21) in the sub sense amplifier circuit 30A and the PMOS transistor MP16 in the sense amplifier circuit 26 cause the read bitline RBLi to be promptly pulled up to the power source level Vdd. The sense amplifier circuit 26 outputs read data in response to the voltage level of the read bitline RBLi.

When data "1" is read from the selected memory cell 20A (when the magnetoresistive element J1 has a relatively high resistance value and the magnetoresistive element J0 has a relatively low resistance value), on the other hand, the voltage level Vs of the gate of the NMOS transistor MN1 is higher than the voltage level Vdd/2, and the NMOS transistor MN1 in the selected memory cell 20A is substantially placed into the on-state. In this case, charges accumulated on the sub bitline SRBLi and the read bitline RBLi are rapidly discharged by the NMOS transistor MN1, so that the sub bitline SRBLi and the read bitline RBLi are pulled down to the ground level Vss. The sense amplifier circuit 26 outputs read data in response to the voltage level on the read bitline RBLi.

The configuration of the memory cell 20A shown in FIG. 25 may suffer from a problem that the NMOS transistor MN1 is not sufficiently turned off when the MR ratios of the magnetoresistive elements J0 and J1 are small. In order to avoid this problem, a plurality of magnetoresistive elements may be serially connected between the plate line PLj and the cell node N1, while the plurality of magnetoresistive elements may be serially connected between the cell node N1 and the ground terminal 12, as shown in FIG. 27. FIG. 27 shows the configuration in which two magnetoresistive elements J0 and J0' are connected between the plate line PLj and the cell node N1, and two magnetoresistive elements J1 and J1' are connected between the plate line PLj and the cell node N1. The serial connection of the plurality of the magnetoresistive elements enables increasing the amplitude of the read signal generated on the sub bitline SRBLi.

As explained above, the MRAM in this embodiment is designed to amplify a slight change in the voltage level on the cell node N1 by the sub-sense amplifier circuits 30A provided in the memory array and the NMOS transistor MN1 provided in the memory cell 20A, and to thereby generate a read signal having the logic amplitude on the read bitline RBLi. Accordingly, the MRAM in this embodiment achieves high-speed read operation.

Additionally, the hierarchical bitline structure of the MRAM in this embodiment effectively reduces the load of the respective memory cells 20. Therefore, the MRAM in this embodiment effectively reduces the increase in the loads connected the bitlines. This preferable achieves the high-speed read operation.

It should be understood that the present invention is not limited to the above described embodiments. For example, the configuration of the sub-sense amplifier circuit 30A in the third embodiment may be variously changed. More specifically, a resistance element such as a well resistance or a polysilicon resistance may be used in place of the diode-connected NMOS transistor MN21 (or the PMOS transistor MP21).

What is claimed is:

1. A semiconductor memory device comprising:
    a memory array including memory cells arranged in rows and columns; and
    a sense amplifier circuit
    wherein each of said memory cells comprising:
        at least one magnetoresistive element storing data; and
        an amplifying member used to amplify a signal generated by a current through said at least one magnetoresistive element, and
    wherein said sense amplifier circuit identifies data stored in said at least one magnetoresistive element in response to an output signal of said amplifying member.

2. The semiconductor memory device according to claim 1, wherein said at least one magnetoresistive element includes serially-connected magnetoresistive elements, and
    wherein an input of said amplifying member is connected to a cell node at which two of said serially-connected magnetoresistive elements are connected together.

3. The semiconductor memory device according to claim 2, wherein said memory cell array further includes:
    first write bitlines;
    second write bitlines; and
    read bitlines connected with said sense amplifier circuit,
    wherein each of said memory cells includes:
    a first switch element connected between said cell node and associated one of said first write bitlines; and
    a second switch element connected between said cell node and associated one of said second write bitlines, and
    wherein an output of said amplifying member is connected with associated one of said read bitlines.

4. The semiconductor memory device according to claim 2, wherein said memory array includes a plurality of pull-up lines,
    wherein said serially-connected magnetoresistive elements include:
    a first magnetoresistive element connected between said cell node and associated one of said plurality of pull-up lines; and
    a second magnetoresistive element connected between said cell node and a ground terminal.

5. The semiconductor memory device according to claim 2, wherein at least one switch element is inserted into a current path along which a read current is flown through said serially-connected magnetoresistive elements.

6. The semiconductor memory device according to claim 2, wherein said amplifying member includes an inverter.

7. The semiconductor memory device according to claim 6, wherein said inverter includes:
    a first PMOS transistor having a source connected with a power supply terminal; and
    a first NMOS transistor having a source connected with a ground terminal, and
    wherein gates of said first PMOS transistor and first NMOS transistors are commonly connected with said cell node, and
    wherein drains of said first PMOS transistor and first NMOS transistors are commonly connected with a read bitline that is connected with said sense amplifier circuit.

8. The semiconductor memory device according to claim 6, wherein said inverter includes:
    a depletion NMOS transistor having a drain connected with a power supply terminal and a gate connected with a source thereof; and
    an NMOS transistor connected having a drain connected with said source of said depletion NMOS transistor, a gate connected with said cell node, and a source connected with a ground terminal, and wherein said drain of said NMOS transistor is further connected with a read bitline that is connected with said sense amplifier circuit.

9. The semiconductor memory device according to claim 6, wherein said inverter includes:
   a diode-connected NMOS transistor having a drain connected with a power supply terminal and a gate connected with said drain thereof; and
   an NMOS transistor having a drain connected with a source of said diode-connected NMOS transistor and a source connected with a ground terminal.

10. The semiconductor memory device according to claim 7, wherein each of said memory cells further includes a second NMOS transistor connected between an output of said inverter and a read bitline connected with said sense amplifier circuit.

11. The semiconductor memory device according to claim 10, wherein each of said memory cells further includes a second PMOS transistor connected between said output of said inverter and said read bitline.

12. The semiconductor memory device according to claim 7, wherein said inverter further includes a second NMOS transistor connected between said read bitline and said ground terminal in series with said first NMOS transistor, and a gate of said second NMOS transistor is connected with a read word line.

13. The semiconductor memory device according to claim 7, wherein said inverter further includes a second PMOS transistor connected between said read bitline and said power supply terminal in series with said first PMOS transistor, and a gate of said second NMOS transistor is connected with a read word line.

14. The semiconductor memory device according to claim 2, wherein said amplifying member includes serially-connected inverters.

15. The semiconductor memory device according to claim 1, further comprising:
   a write circuit configured to write a write data into said at least one magnetoresistive element within one of said memory cells selected by a write address;
   a data latch configured to latch output data received from said sense amplifier circuit;
   an output circuit externally outputting data latched by said data latch; and
   an address matching detection circuit configured to detect matching of said write address and a read address,
   wherein said data latch is adapted to latch said write data from said write circuit in response to matching of said write address and said read address.

16. A semiconductor memory device comprising:
   a memory array including memory cells arranged in rows and columns; and
   a sense amplifier circuit
   wherein each of said memory cells comprises at least one magnetoresistive element storing data,
   wherein said memory array further includes sub-sense amplifiers, each of which is associated with n memory cells and used to amplify a signal generated by a current through said at least one magnetoresistive element, n being an integer of two or more, and
   wherein said sense amplifier circuit identifies data stored in said at least one magnetoresistive element in response to an output signal received from said sub-sense amplifiers.

17. The semiconductor memory device according to claim 16, wherein said at least one magnetoresistive element includes serially-connected magnetoresistive elements, and
   wherein an input of said amplifying member is connected to a cell node at which two of said serially-connected magnetoresistive elements are connected together.

18. The semiconductor memory device according to claim 17, wherein each of said memory cells further comprises:
   an NMOS transistor connected between said cell node and a sub bitline connected with associated one of said sub-sense amplifiers.

19. The semiconductor memory device according to claim 17, wherein each of said memory cells further comprises:
   an NMOS transistor having a gate connected with said cell node, a source connected with a ground terminal, and a drain connected with a sub bitline connected with associated one of said sub-sense amplifiers, and
   wherein each of said sub-sense amplifiers comprises
   a diode-connected MOS transistor connected between said sub bitline and a power supply terminal; and
   a switch element connected between said sub bitline and a bitline connected with said sense amplifier circuit.

* * * * *